US012597916B2

(12) United States Patent
Fontana

(10) Patent No.: US 12,597,916 B2
(45) Date of Patent: Apr. 7, 2026

(54) HALF-BRIDGE DRIVER CIRCUIT, RELATED INTEGRATED CIRCUIT, HALF-BRIDGE SWITCHING CIRCUIT AND METHOD

(71) Applicant: STMICROELECTRONICS S.r.l., Agrate Brianza (IT)

(72) Inventor: Marco Giovanni Fontana, Milan (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 50 days.

(21) Appl. No.: 18/407,782

(22) Filed: Jan. 9, 2024

(65) Prior Publication Data

US 2024/0243739 A1     Jul. 18, 2024

(30) Foreign Application Priority Data

Jan. 13, 2023     (IT) ........................ 102023000000381

(51) Int. Cl.
*H03K 17/06*          (2006.01)
*H03K 17/30*          (2006.01)
*H03K 17/687*         (2006.01)
(52) U.S. Cl.
CPC ......... *H03K 17/063* (2013.01); *H03K 17/302* (2013.01); *H03K 17/6871* (2013.01);
(Continued)
(58) Field of Classification Search
CPC .............. H03K 17/063; H03K 17/302; H03K 17/6871; H03K 2217/0063; H03K 2217/0072; H03K 17/0822; H03K 2217/0081; H03K 17/081; H03K 17/08122; H03K 17/0814; H03K 17/08142;
(Continued)

(56) References Cited

U.S. PATENT DOCUMENTS 7,215,189 B2    5/2007  Wilhelm
7,456,658 B2   11/2008  Locatelli et al.
(Continued)

FOREIGN PATENT DOCUMENTS

CN     103683871 A     3/2014
CN     109039029 A    12/2018
(Continued)

*Primary Examiner* — Jung Kim
(74) *Attorney, Agent, or Firm* — Seed Intellectual Property Law Group LLP

(57)          ABSTRACT
A half-bridge driver circuit is provided. The circuit includes a detector circuit that generates a signal indicating whether a floating reference voltage is greater than a second supply voltage. The detector circuit includes a first circuit, a second circuit and combinational logic circuit. A first comparator circuit of the first circuit monitors a voltage drop at a resistance and sets a first control signal to a first logic level when the monitored voltage drop is smaller than a first threshold. A second comparator circuit of the second circuit monitors a current provided by an output transistor of a current mirror and sets a second control signal to a first logic level when the monitored current is greater than a second threshold. The combinational logic circuit asserts the signal when the first control signal has the respective first logic level or the second control signal has the respective first logic level.

19 Claims, 7 Drawing Sheets

(52) U.S. Cl.
CPC ................ *H03K 2217/0063* (2013.01); *H03K 2217/0072* (2013.01)

(58) Field of Classification Search
CPC ...... H03K 2217/0045; H03K 2217/00; H02M 1/0006; H02M 1/08
See application file for complete search history.

(56) References Cited

U.S. PATENT DOCUMENTS

| | | | |
|---|---|---|---|
| 7,538,583 B2 | 5/2009 | Bryson | |
| 8,593,211 B2 | 11/2013 | Forghani-Zadeh et al. | |
| 9,859,883 B2 | 1/2018 | Huang | |
| 11,476,845 B2 | 10/2022 | Fontana et al. | |
| 11,502,685 B2 * | 11/2022 | Karasawa | H02M 3/1588 |
| 2002/0159276 A1 | 10/2002 | Deboy et al. | |
| 2008/0290841 A1 | 11/2008 | Chang et al. | |
| 2013/0265024 A1 | 10/2013 | Chen | |
| 2020/0044650 A1 | 2/2020 | Fujita et al. | |
| 2021/0044290 A1 | 2/2021 | Hama et al. | |
| 2022/0006450 A1 | 1/2022 | Fontana et al. | |

FOREIGN PATENT DOCUMENTS

| | | | |
|---|---|---|---|
| JP | 2018007403 A | 1/2018 | |
| WO | WO 2016057878 A1 | 4/2016 | |
| WO | WO 2019193805 A1 | 10/2019 | |

* cited by examiner

FIG. 4

HALF-BRIDGE DRIVER CIRCUIT, RELATED INTEGRATED CIRCUIT, HALF-BRIDGE SWITCHING CIRCUIT AND METHOD

BACKGROUND

Technical Field

Various embodiments of the present disclosure relate to half-bridge driver circuits.

Description of the Related

High voltage (HV) half-bridge switching circuits are well-known in the art and may be used in various applications, such as motor driver devices, electronic ballasts for fluorescent lamps and other power supply devices.

FIG. 1 shows an example of a half-bridge switching circuit comprising a half-bridge driver circuit with a conventional high-side bootstrap architecture.

In the example considered, the half-bridge switching circuit 10 comprises a high-side electronic switch HS and a low-side electronic switch LS. Specifically, these electronic switches HS and LS form a half-bridge, i.e., (the current path of) the high-side electronic switch HS is connected between a switching node 102a and a first terminal 108 and (the current path of) the low-side electronic switch LS is connected between a switching node 102a and second terminal 102b. For example, the terminal 108 may be connected to a (positive) supply voltage $V_{BUS}$ and the terminal 102b may be connected to a reference voltage, such as ground GND. For example, the supply voltage $V_{BUS}$ is usually a DC voltage, e.g., supplied by a battery or obtained from an AC voltage, such as the mains, via a rectifier circuit, such as a bridge rectifier, optionally also comprising a filter capacitor. Accordingly, the value of the DC voltage $V_{BUS}$ may be selected in a wide range of values, e.g., between 20 V and 1 kV, such as between 90 and 200 V.

Accordingly, by driving the control terminals of the high-side electronic switch HS and the low side electronic switch LS, the switching node 102a, i.e., the intermediate node between the high-side electronic switch HS and the low-side electronic switch LS, may be connected selectively to the supply voltage $V_{BUS}$ or the reference voltage/ground GND. For example, often the voltage $V_{OUT}$ between the terminal 102a and the terminal 102b is used to drive a load L, such as an inductive load. Those of skill in the art will appreciate that the connection of the load L is just an example. For example, the load L could also be connected in parallel with the high-side electronic switch HS or two half-bridge circuits may also be used to drive the load with a full-bridge arrangement.

In many applications, the electronic switches HS and LS are implemented with power transistors, such Field-Effect Transistors (FET), such as n-channel FETs. For example, often the transistors HS and LS are implemented with Metal-Oxide-Semiconductor Field-Effect Transistors (MOSFET) or Insulated-Gate Bipolar Transistors (IGBT). Moreover, recently Gallium Nitride (GaN) power transistors are increasingly used in such half-bridges in the place of conventional power transistors. For instance, GaN power transistors may provide lower gate capacitance and higher switching speed. It is noted that the high-side and low-side transistors HS and LS may comprise respective drain-body diodes as schematically shown in FIG. 1.

For example, when using n-channel FETs, a drain terminal of the high-side transistor HS is connected (e.g., directly)

to the terminal 108 and a source terminal of the high-side transistor HS is connected (e.g., directly) to the terminal 102a. Similarly, a drain terminal of the low-side transistor LS is connected (e.g., directly) to the terminal 102a and a source terminal of the low-side transistor LS is connected (e.g., directly) to the terminal 102b.

Accordingly, typically, the half-bridge circuit 10 comprises also a half-bridge driver circuit HBD configured to drive the gate terminal of the high-side transistor HS as a function of a first control signal $IN_{HS}$ and the gate terminal of the low-side transistor LS as a function of a second control signal $IN_{LS}$.

For example, in order to drive the gate terminals 120a and 120b, the half-bridge switching circuit 10 may comprise two input terminals 100a and 100b configured to receive a DC supply voltage $V_{CC}$. In general, the supply voltage $V_{CC}$ may be provided by any suitable power source PS. For example, the power source PS may be a battery, or the power source PS may be implemented via a voltage source, such as a linear regulator or a switched mode power supply, receiving at input, e.g., the voltage $V_{BUS}$. According to the specific application, the value of the supply voltage $V_{CC}$ may be selected in a range of values, e.g., between 3 V and 24 V. For example, when driving enhancement GaN power transistors, the supply voltage $V_{CC}$ may be approximately 5 V.

Such driver circuits HBD are well-known in the art, and are often provided as integrated circuits (IC). Typically, the half-bridge driving circuit HBD comprises a high-side gate driver circuit 12a providing at an output terminal 120a a drive signal for the gate terminal of the high-side transistor HS, and a low-side gate driver circuit 12b providing at an output terminal 120b a drive signal for the gate terminal of the low-side transistor LS. In general, the integrated circuit of the half-bridge driving circuit HBD may also comprise the electronic switches HS and/or LS, and/or a voltage source implementing the power supply PS.

For example, in order to close a n-channel FET, the gate-source voltage, i.e., the voltage at the terminal 120b with respect to the terminal 102b, should exceed the threshold voltage of the n-channel FET. For example, for this purpose, the low-side gate driver circuit 12b may be configured to open the low-side electronic switch LS by connecting the terminal 120b to the source terminal of the low-side transistor, i.e., the terminal 102b, and close the low-side electronic switch by connecting the terminal 120b to a positive supply voltage, e.g., the voltage $V_{CC}$ received via the terminals 100a and 100b, wherein the low-side gate driver circuit 12b is configured to close the low-side switch LS when the signal $IN_{LS}$ is asserted, e.g., set to high, and open the low-side switch LS when the signal $IN_{LS}$ is de-asserted, e.g., set to low.

Similarly, the high-side gate driver circuit 12a may be configured to open the high-side electronic switch HS by connecting the terminal 120a to the source terminal of the high-side transistor HS, i.e., the terminal 102a, and close the high-side electronic switch HS by connecting the terminal 120a to a terminal 104 having applied a positive supply voltage $V_{BOOT}$, wherein the high-side gate driver circuit 12a is configured to close the high-side switch HS when the signal $IN_{HS}$ is asserted, e.g., set to high, and open the high-side switch HS when the signal $IN_{HS}$ is de-asserted, e.g., set to low.

In general, the driver circuits 12a and/or 12b may also implement a slew-rate control, wherein the gate terminals 120a and 120b are not connected directly to the above voltages, but the respective gate-source capacitance (and possible other capacitances connected between the respective gate and source terminals) are charged and discharged via the above voltages. For example, the gate terminal 120*b* may be charged via a current flow from the supply voltage $V_{CC}$ or discharged via a current flow to the reference voltage at the terminal 102*b*. Similarly, the gate terminal 120*a* may be charged via a current flow from the supply voltage $V_{BOOT}$ or discharged via a current flow to the terminal 102*a*.

Accordingly, the switching node 102*a* may be:

connected to the voltage $V_{BUS}$, when the high-side switch HS is closed and the low-side switch LS is opened;

connected to the reference voltage/ground GND, when the high-side switch HS is open and the low-side switch LS is closed;

placed in a high-impedance state, when the high-side switch HS and the low-side switch LS are opened.

Accordingly, the high-side driver 12*a* is usually supplied with a different supply voltage, which is usually implemented within a floating section FS between the nodes 104 and 102*a* ($V_{BOOT}$ to $V_{OUT}$). For this reason, the high-side driver 12*a* has usually associated, e.g., comprises, a level shifter 14 configured to generate a level-shifted version of the signal $IN_{HS}$ and the high-side driver 12*a* generates the gate voltage at the terminal 120*a* based on the level-shifted version of the signal $IN_{HS}$, while the low-side driver 12*b* may directly receive the signal $IN_{LS}$. For example, possible implementations of such a level shifter are disclosed in United States patent Application n. US 2022/0006450 A1, which is incorporated herein by reference.

FIG. 1 also shows a convention solution for generating the supply voltage $V_{BOOT}$ at the terminal 104. Specifically, in the example considered, a bootstrap architecture is used to generate a DC voltage supply $V_{CB}$ between the nodes 104 and 102*a*, with the DC voltage supply $V_{CB}$ being floating with respect to the DC low voltage $V_{CC}$, with $V_{BOOT} = V_{CB} + V_{OUT}$, thereby provide the floating section FS of the half-bridge switching circuit 10. Thus, the DC voltage supply $V_{CB}$ may be derived from the DC low voltage supply $V_{CC}$, for example, by providing a high voltage diode DB having the anode connected to the positive terminal 100*a* of the DC low voltage supply $V_{CC}$ and the cathode connected to the floating supply voltage node 104.

As exemplified in FIG. 1, a bootstrap capacitance $C_B$ (e.g., a capacitor mounted externally to the integrated circuit of the half-bridge driver circuit HBD) provided between the (positive) output terminal 102*a* and the floating supply voltage node 104 may be configured to store charge (during a bootstrap "recharge" phase) in order to provide the DC voltage supply $V_{CB}$ for supplying (during a bootstrap "supply" phase) the high-side gate driver circuit 12*a*.

Substantially, when the low-side electronic switch LS is closed (bootstrap recharge phase), the diode DB is closed and the capacitor $C_B$ is charged approximately to the voltage $V_{CC}$ (neglecting the voltage drop at the diode DB), i.e., $V_{OUT} = 0V$ and $V_{BOOT} = V_{CB} = V_{CC}$. Conversely, when the low-side electronic switch LS is opened, the diode DB is opened and the node 104 is at a voltage $V_{BOOT}$ corresponding to the sum of the voltage $V_{CB}$ and a voltage $V_{OUT}$ at the switching node 102*a*, i.e., $V_{BOOT} = V_{CB}$.

Thus, the voltage $V_{CB}$ is floating with the voltage $V_{OUT}$ and may be used to supply the driver circuit 12*a*, which thus may close the high-side electronic switch HS. In this respect, once the high-side electronic switch HS is closed (bootstrap supply phase), the node 102*a* is set to the voltage $V_{BUS}$, i.e., $V_{BOOT} = V_{BUS} + V_{CB}$. Thus, the capacitance $C_B$ should be selected in order to store during the recharge phase enough energy in order to supply the high-side driver 12*a* during the bootstrap supply phase. For example, in case of enhancement GaN power transistors, the voltage $V_{CB}$ may be between 4 V and 6 V.

Document US 2022/0006450 A1 discloses in this respect also arrangements for improving the re-charging of the bootstrap capacitance $C_B$, e.g., in order to maintain the voltage $V_{CB}$ below an upper threshold $V_{TH,H}$. Preferably, the voltage $V_{CB}$ should also be greater than a lower threshold $V_{TH,L}$. For example, in this way the voltage $V_{CB}$ may be maintained within a range of values (e.g., 4 V to 6 V). For example, a gate voltage above said range may stress the high-side transistor HS, and a gate voltage below said range may reduce the system efficiency.

For example, FIG. 2 shows an example of a half-bridge switching circuit 10' in line with document US 2022/0006450 A1.

Specifically, compared to FIG. 1, a current limiter circuit has been added, which controls the charge current used to charge the capacitor $C_B$. For example, the current limiter circuit may comprise an electronic switch Q1', such as a transistor having a drain-body diode D1', and a respective control circuit 62. Moreover, the diode DB is preferably replaced with an active diode circuit, e.g., comprising an electronic switch Q3, such as a transistor having a drain-body diode D3, and a respective control circuit 60.

Specifically, the current limiter circuit is in the floating section FS, and the control circuit 62 may be supplied and driven in the floating section FS of the half-bridge driving circuit HBD.

As discussed in the foregoing, the capacitor $C_B$ should be charged during the bootstrap recharge phase (when the electronic switch HS is opened and the electronic switch LS is closed) and the capacitor $C_B$ supplies the driver circuit 12*a* (and possible other circuits in the floating section FS) during a bootstrap supply phase (at least when the electronic switch HS is closed and the electronic switch LS is opened). Specifically, as mentioned before, during the recharge phase, the voltage $V_{BOOT}$ at the floating supply voltage node 104 is typically below the voltage $V_{CC}$ and the current flowing through the bootstrap diode (DB, or D3 and Q3) and the current limiter (e.g., Q1') may charge the bootstrap capacitance $C_B$. Accordingly, the value reached by the bootstrap voltage $V_{CB}$ during the recharge phase depends on the amount of current flowing during the recharge phase from the node 100*a* through the low-side transistor LS. As discussed in greater detail in document US 2022/0006450 A1, the following situations may possibly arise:

i) in case of negligible current recirculation on the low-side transistor LS, the bootstrap voltage $V_{CB}$ may rise poorly; in this case, the control circuit 60 may switch on the switch Q3 to increase the current flow, thereby facilitating a higher final value of the bootstrap voltage $V_{CB}$ at the end of the recharge phase; and ii) in case of current recirculation on the low-side transistor LS (in particular, at high currents), the bootstrap voltage $V_{CB}$ would exceed the upper threshold $V_{TH,H}$ (e.g., equal to 6 V); in this case, the control circuit 62 may switch-off the current limiter circuit (e.g., the transistor Q1') when the bootstrap voltage $V_{CB}$ reaches a desired/requested value $V_{TH,H}$ (e.g., equal to 5.4 V).

In the example considered, the level shifter may thus be supplied by the voltage $V_{BOOT}$ (node 104) or preferably a voltage $V_S$ at the intermediate node 106 between the diode and the current limiter. In fact, the voltage $V_{BOOT}$ at the node 104 may be below the voltage $V_{CC}$. Thus, by using the diode D3 of the transistor Q3 (and similarly DB) and the diode D1' of the transistor Q1' arranged in a "back to back" configuration, the voltage $V_S$ is set to the maximum between $V_{CC}$ and $V_{BOOT}$ (minus the voltage drop at the respective diode), whereby the voltage $V_S$ is set approximately to $V_{CC}$ when the electronic switch LS is closed and to $V_{BOOT}$ when the electronic switch HS is closed.

FIG. 3 is a circuit block diagram exemplary of a possible implementation of a current limiter circuit and the related control circuitry.

Specifically, as mentioned before, the current limiter circuit may comprise a transistor Q1' having a current path connected (e.g., directly) between nodes 106 and 104, wherein the transistor Q1' comprises a respective drain-body diode D1'. In order to have the drain-body diode D1' arranged in the desired direction (i.e., having the cathode coupled to node 106 and the anode coupled to node 104), the current limiter transistor Q1' may be implemented with a p-channel high-voltage FET, such as a PMOS, having the source terminal and the body terminal connected to node 106. In this exemplary case, the gate-source voltage which drives the transistor Q1' to switch the channel on and off may be lower than the voltage $V_S$.

Alternatively, the current limiter transistor Q1' may be implemented with an n-channel high-voltage FET, such as an NMOS, having the source terminal connected to node 104. In this exemplary case, the gate-source voltage which drives such transistor to switch the channel on and off may be higher than the voltage $V_{BOOT}$ and may be generated by an additional circuit, such as a charge pump circuit (not visible in FIG. 3).

As exemplified in FIG. 4, the voltage $V_{BOOT}$ at the node 104 may switch from a low value during a bootstrap recharge phase $T_2$ (e.g., around $V_{CC}$) to a high value during a bootstrap supply phase $T_1$ (e.g., much higher than $V_{CC}$) and then back to the low value. For instance, in typical applications, the variation of voltage $V_{BOOT}$ at the node 104 may occur at a very high speed, e.g., at a rate exceeding 100 V/ns (1 ns=$10^{-9}$ s).

As a result of the voltage $V_{BOOT}$ switching to a high value (entering the bootstrap supply phase $T_1$), the node 106 may be pulled up to a voltage (almost) equal to $V_{BOOT}$ by the current flowing in the drain-body diode D1' of the current limiter transistor Q1', as it is forward biased. During the bootstrap supply phase $T_1$, while the voltage $V_{BOOT}$ is in the high-voltage range, the node 106 may be still pulled up by the drain-body diode D1' of the current limiter transistor. Optionally, the control circuit 62 may also close the transistor Q1' during the bootstrap supply phase $T_1$ in order to reduce the voltage drop between node 106 and node 104. This also ensures that the switch Q1' is closed already at the beginning of the falling phase, e.g., when entering the bootstrap recharge phase $T_2$.

Moreover, as a result of the voltage $V_{BOOT}$ switching back to a low value (entering the bootstrap recharge phase $T_2$), the drain-body diodes D3 and D1' of the active diode circuit and of the current limiter circuit may be both in reverse biasing, and the node 106 may remain floating at high voltage with the risk of overcoming a breakdown voltage of the circuitry connected between node 106 and nodes 104, 102a. In order to counter such overvoltage events, the node 106 may be discharged towards node 104 with a current sufficient to limit the voltage difference between nodes 106 and 104 within the circuitry breakdown voltage. For example, when maintaining switched on the transistor Q1 at the end of the bootstrap supply phase $T_1$, the node 106 will be discharged through the conductive current path between node 106 and node 104.

Document US 2022/0006450 A1 discloses in this respect that also an optional discharge circuit may be provided, e.g., in case the transistor Q1' is not switched on during the phase $T_1$ or when the conductivity of the transistor Q1' is not sufficient to allow peak currents high enough to discharge the node 106 at a sufficient speed. For example, in FIG. 3, the discharge circuit is implemented with a transistor Q2 connected in parallel to the current limiter transistor Q1'. For instance, the discharge transistor Q2 may be a n-channel FET, such as an NMOS, having a source terminal connected (e.g., directly) to node 104 and a drain terminal connected (e.g., directly) to node 106. The discharge transistor Q2 may comprise a respective drain-body diode D2 parallel to diode D1'. The related control circuitry of the gate terminal of the transistor Q2 may be implemented, e.g., with a resistive component R4 (e.g., a resistor) connected (e.g., directly) between the source and the gate of transistor Q2, and a capacitive component C4 (e.g., a capacitor) connected (e.g., directly) between the drain and the gate of transistor Q2.

Accordingly, in line with the disclosure of document US 2022/0006450 A1, the transistor Q1' may be switched off only during the portion of the bootstrap recharge phase $T_2$ when the voltage $V_{CB}$ is greater than a threshold voltage $V_{TH}$. Conversely, the transistor Q1' should be switched on:

during the bootstrap supply phase $T_1$, and during the portion of the bootstrap recharge phase $T_2$ when the voltage $V_{CB}$ is smaller than a threshold voltage $V_{TH}$.

Specifically, in order to detect the bootstrap recharge phase and the bootstrap supply phase, the control circuitry driving the current limiter transistor Q1' may comprise a detector circuit DT1 (e.g., a comparator circuit) configured to assert a control circuit HBlow, e.g., set the signal HBlow to high, in response to determining that the voltage $V_{OUT}$ is smaller than the voltage $V_{CC}$, which indicates that the half-bridge circuit is in the bootstrap recharge phase $T_2$. Conversely, in response to determining that the voltage $V_{OUT}$ is greater than the voltage $V_{CC}$, which indicates that the half-bridge circuit is in the bootstrap supply phase $T_1$, the detector circuit DT1 de-asserts the control circuit HBlow, e.g., sets the signal HBlow to low. For example, for this purpose, the comparator circuit DT1 may receive the voltage $V_{CC}$ at a positive input terminal and the voltage $V_{OUT}$ at a negative input terminal.

Moreover, the control circuit may comprise a second detector circuit DT2 configured to de-assert a control signal VBOov, e.g., set the signal VBOov to low, in response to determining that the voltage $V_{CB}$ is smaller than the threshold voltage $V_{TH}$, which indicates that the capacitor $C_B$ should be charged. Conversely, in response to determining that the voltage $V_{CB}$ is greater than the threshold voltage $V_{TH}$, which indicates that the capacitor $C_B$ is sufficiently charged, the detector circuit DT2 asserts the control signal VBOov, e.g., sets the signal VBOov to high. For example, in the example considered, the voltage $V_{CB}$ or a scaled version $V_R$ thereof is applied to the positive input terminal of the comparator DT2. For example, the scaled voltage $V_R$ may be provided via a voltage divider R1 connected between the nodes 104 and 102a, i.e., between the voltages $V_{BOOT}$ and $V_{OUT}$. Conversely, a reference voltage $V_{REF}$ referred to the voltage $V_{OUT}$ is applied to the negative input terminal of the comparator DT2. Specifically, the reference voltage $V_{REF}$ corresponds to the maximum value for the voltage $V_{CB}$ or a scaled version $V_R$. For example, the reference voltage $V_{REF}$ be generated by a voltage generator VG2 connected between the negative input terminal of the comparator DT2 and the terminal 102a.

Accordingly, in the example considered, the control circuit is configured to close the electronic switch Q1 in response to determining that the signal HBlow is de-asserted, e.g., set to low, or the signal VBOov is de-asserted, e.g., set to low. Conversely, the control circuit is configured to open the electronic switch Q1 in response to determining that the signal HBlow is asserted, e.g., set to high, and the signal VBOov is asserted, e.g., set to high.

For example, in the example considered, the control circuit comprises for this purpose a combinational logic circuit 70, such as an AND gate, configured to generate a signal Q1off by combining the signals HBlow and VBOov. For example, in FIG. 3, the signal Q1off is asserted when the signal HBlow is asserted and the signal VBOov is asserted, whereby the switch Q1 should be opened when the signal Q1off is asserted, e.g., when the signal Q1off is set to high. Moreover, in the example considered, the control circuit comprise a switching circuit SW configured to drive the gate terminal of the transistor Q1' as a function of the signal Q1off. For example, the circuit SW may be configured to:

in response to determining that the signal Q1off is asserted, open the transistor Q1', e.g., by connect the gate terminal of a p-channel FET Q1' to the node 106, and in response to determining that the signal Q1off is de-asserted, close the transistor Q1', e.g., by connect the gate terminal of a p-channel FET Q1' to a voltage being smaller than the voltage $V_S$ at the node 106.

The inventors have observed that the detector circuit DT2 may be implemented with a conventional comparator, because both the input and output terminals are referred to the same reference voltage, i.e., the voltage $V_{OUT}$ at the terminal 102a, which corresponds to the floating level of the floating section FS.

Conversely, a more complex circuit may be required for the floating level detector circuit DT1, because the input voltages $V_{CC}$ and $V_{OUT}$ are rather referred to the reference voltage at the node 102b/ground GND, while the output signal HBlow is referred to the voltage $V_{OUT}$ at the terminal 102a. Moreover, the voltage $V_{OUT}$ may reach high voltage levels (comparable to the voltage $V_{BUS}$).

In general, the detector circuit DT1 may not simply use the signals $IN_{LS}$ and $IN_{HS}$, because the voltage state (high or low voltage state) is not univocally determined by the signals $IN_{LS}$ and $IN_{HS}$. For example, during the intermediate periods between the intervals $T_1$ and $T_2$, both electronic switches HS and LS are switched off, and the voltage $V_{OUT}$ depends on the load characteristics, such as the current direction of an inductive load L. Moreover, during the testing of the driver circuit HBD, a "robustness test" may be performed, wherein the electronic switches HS and LS are not connected to the half-bridge driver HDB, or connected to the half-bridge driver HDB with uncorrelated configurations.

For example, in principle, the detector circuit DT1 could be implemented with a differential comparator. However, the inventor has observed that this may pose significant stresses on the input terminals of the comparator because the voltage $V_{OUT}$ is floating and may also reach the voltage $V_{BUS}$. For example, a classical gate-driven comparator solution may not be feasible, because the voltages $V_{CC}$ and $V_{OUT}$ are separated by a high voltage. For example, gate terminals of typical MOS transistors are usually not able to sustain such high positive or negative gate-source voltages. A possible solution could be a "drain driven comparator," which requires a bias current at each input. While this bias current may be minimized, a high power-consumption is still required, because one of the two input terminals is in a high-voltage state. Moreover, such drain driven comparators have usually a slow response time.

Alternatively, the comparator may not be placed in the floating section FS, but may be referred to the reference voltage at the node 102b/ground GND. In this case, the output signal HBlow may be level shifted via an additional level shifter to the voltage levels in the floating level section FS (similar to the circuit 14). However, the inventor has observed that the detector circuit DT1 should preferably operate in the floating section FS, because its output should be quickly available in this domain. Apart from the additional power consumption and noise immunity problems, such a level shifter introduces an additional delay in the detection. In any case, due to the high-voltage difference, also in this case a drain driven comparator would be required.

BRIEF SUMMARY

One or more embodiments of the present disclosure relate thus to more efficient solutions for implementing such floating level detector circuit.

According to one or more embodiments, such an object can be achieved by means of a half-bridge driver circuit having the features set forth in the claims that follow. Embodiments moreover concern a related integrated circuit, half-bridge switching circuit and method.

As mentioned before, various embodiments of the present disclosure relate to a half-bridge driver circuit configured to drive a half-bridge. Specifically, the half-bride comprises a high-side electronic switch and a low-side electronic switch connected between a supply voltage and a reference voltage, such as a ground.

In various embodiments, the half-bridge driver circuit comprises a first node configured to be connected to an intermediate node between the high-side electronic switch and the low-side electronic switch. Accordingly, the voltage at the first node, i.e., at the intermediate node between the high-side electronic switch and the low-side electronic switch, represents a floating reference voltage. The half-bridge driver circuit comprises also a positive and a negative power supply terminal for receiving a further supply voltage, and a second node configured to be connected via a capacitor to the first node. Specifically, a (bootstrap) charge circuit is configured to provide a charge current to the second node when the voltage at the second node is smaller than the further supply voltage, whereby the second node provides a floating supply voltage being floating with the floating reference voltage at the first node, i.e., at the intermediate node between the high-side electronic switch and the low-side electronic switch.

Accordingly, a high-side driver may drive a control terminal of the high-side electronic switch of the half-bridge, wherein the high-side driver is supplied by the floating supply voltage, and a low-side driver may drive a control terminal of the low-side electronic switch of the half-bridge, wherein the low-side driver is supplied by the further supply voltage.

According to the present disclosure, the half-bridge driver circuit comprises also a detector circuit configured to generate a signal indicating whether the floating reference voltage at the first node is greater than the further supply voltage. For example, such a signal may be used to drive a current limiter circuit associated with the charge circuit.

Specifically, according to the present disclosure, the detector circuit comprises a first circuit, a second circuit and a combinational logic circuit.

In various embodiments, the first circuit comprises a first diode having an anode connected to the further supply voltage and a cathode connected to a first decoupling node. The first circuit comprises also a resistance having a first terminal coupled to the first decoupling node and a second terminal connected to the floating reference voltage. Accordingly, when the floating reference voltage is small, a current flows from the further supply voltage through the resistance. Accordingly, a first comparator circuit may be configured to monitor a voltage drop at the resistance. Specifically, in response to determining that the monitored voltage drop is smaller than a first threshold, the first comparator circuit sets a first control signal to a respective first logic level. Conversely, in response to determining that the monitored voltage drop is greater than the first threshold, the first comparator circuit sets the first control signal to a respective second logic level. For example, the first comparator circuit may comprise a first inverter configured to set the first control signal to high when the monitored voltage drop is smaller than the first threshold. In order protect the first circuit, the first circuit may also comprise one or more voltage limiter circuits configured to limit the voltage drop at the resistance, such as one or more clamping diodes and/or a Zener diode.

In order to protect the first circuit, the first circuit may also comprise a first n-channel FET, wherein a drain terminal of the first n-channel FET is connected to the first decoupling node, a source terminal of the first n-channel FET is connected to the first terminal of the resistance and a gate terminal of the first n-channel FET is coupled to the floating supply voltage at the second node.

As will be described in greater detail in the following, this FET may implement a cascode. In order to protect the gate terminal of this FET, the gate terminal of the FET may be connected via a current limiter resistance to the floating supply voltage at the second node, and via a diode and a further current limiter resistance to the first terminal of the resistance.

In various embodiments, the first circuit may also implement a comparator with hysteresis. For example, for this purpose, the resistance may comprise a series connection of a first resistance and a second resistance, wherein the first circuit comprises an electronic switch configured to short-circuit the second resistance in response to detecting that the first control signal is set to the first logic level.

The inventor has observed that, due to the parasitic capacitance associated with the first diode, the detection of the first circuit may not be reliable in case of negative transients of the floating reference voltage.

For this reason, in various embodiments, the second circuit implements a negative transient detection circuit. For this purpose, the second circuit comprises a current mirror comprising an input transistor and an output transistor. The input transistor may have associated a bias circuit connected between the anode of the third diode and the second node. In various embodiments, the second circuit comprises also a second diode having an anode connected to the further supply voltage and a cathode connected to a second decoupling node, and a third diode having a cathode connected to the second decoupling node and an anode connected via the input transistor of the current mirror to the floating reference voltage. Accordingly, also the second and third diode have associate parasitic capacitances, whereby a current flows through the input transistor of the current mirror in case of a negative transient of the floating reference voltage.

Accordingly, in various embodiments, a second comparator circuit may monitor a current provided by the output transistor of the current mirror. Specifically, in response to determining that the monitored current is greater than a second threshold, the second comparator circuit sets a second control signal to a respective first logic level. Conversely, in response to determining that the monitored current is smaller than the second threshold, the second comparator circuit sets the second control signal to a respective second logic level. For example, also the second comparator circuit may comprise an inverter. Moreover, the second comparator circuit may comprise a current-to-voltage conversion circuit, e.g., comprising a resistance connected between the output transistor of the current mirror and the further supply voltage at the second node.

Accordingly, the combinational logic circuit may assert the signal in response to determining that the first control signal has the respective first logic level or the second control signal has the respective first logic level. Conversely, the combinational logic circuit may de-assert the signal in response to determining that the first control signal has the respective second logic level and the second control signal has the respective second logic level.

BRIEF DESCRIPTION OF THE SEVERAL VIEWS OF THE DRAWINGS

One or more embodiments will now be described, by way of example only, with reference to the annexed figures, wherein:

FIG. 4 shows an example of possible waveforms of signals in circuits of FIGS. 2 and 3;

DETAILED DESCRIPTION

In the ensuing description, various specific details are illustrated aimed at enabling an in-depth understanding of the embodiments. The embodiments may be provided without one or more of the specific details, or with other methods, components, materials, etc. In other cases, known structures, materials, or operations are not shown or described in detail so that various aspects of the embodiments will not be obscured.

Reference to "an embodiment" or "one embodiment" in the framework of this description is meant to indicate that a particular configuration, structure, or characteristic described in relation to the embodiment is comprised in at least one embodiment. Hence, phrases such as "in an embodiment," "in one embodiment," or the like that may be present in various points of this description do not necessarily refer to one and the same embodiment. Moreover, particular conformations, structures, or characteristics may be combined in any adequate way in one or more embodiments.

The references used herein are only provided for convenience and hence do not define the sphere of protection or the scope of the embodiments.

Figure 1:
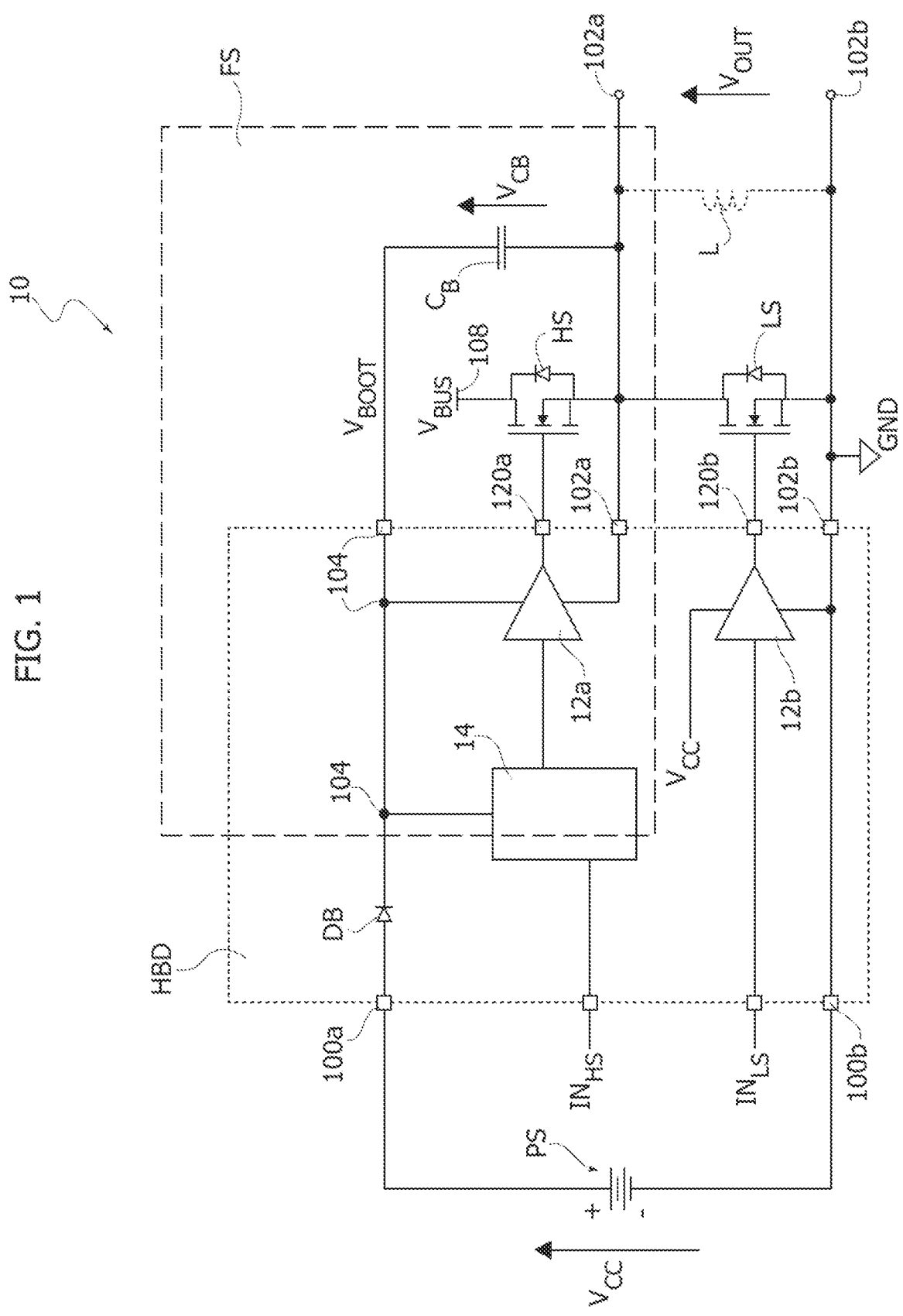
FIG. 1 shows an example of a half-bridge switching circuit and related driving circuitry comprising a high-side bootstrap architecture.
Figure 2:
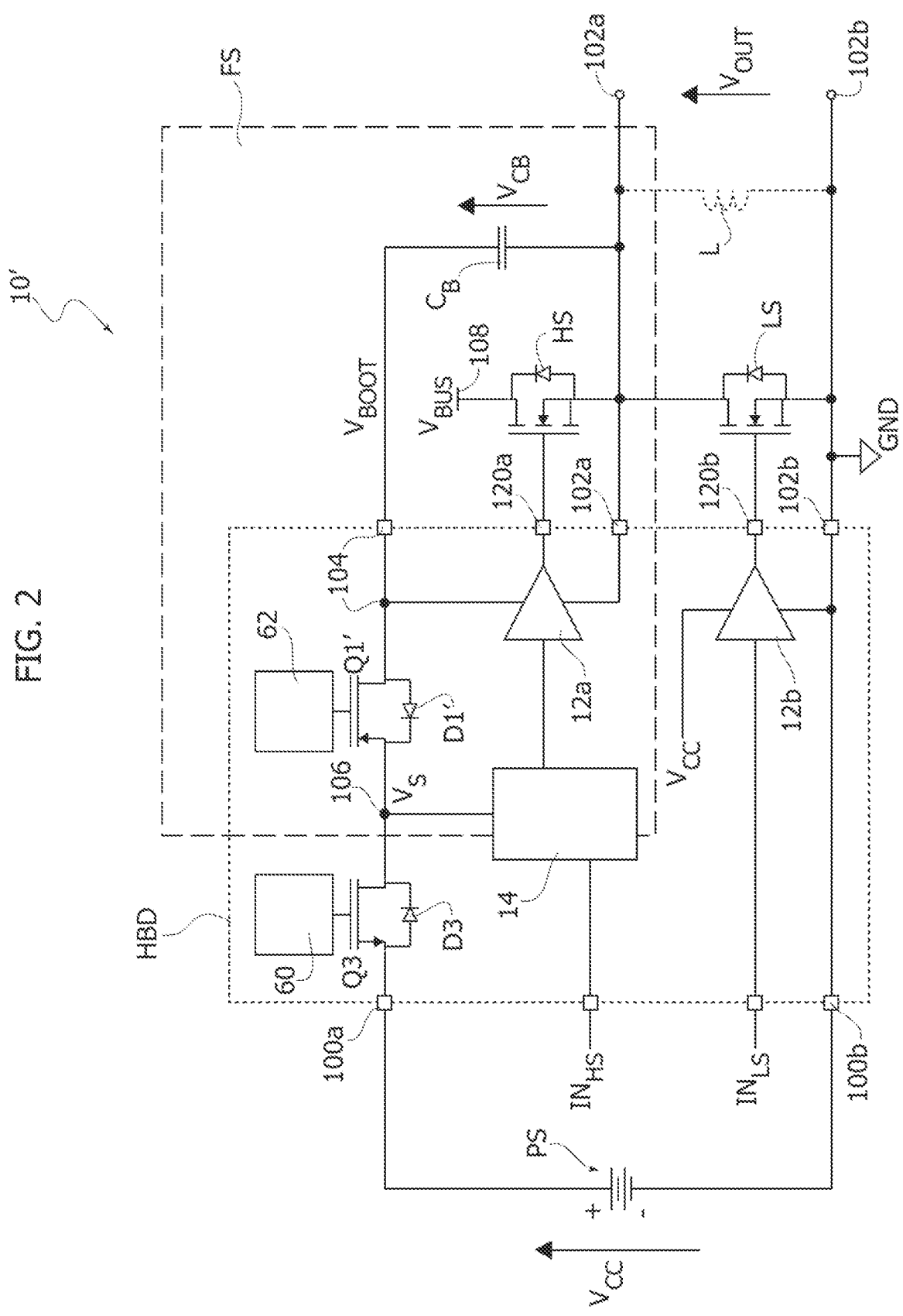
FIGS. 2 and 3 show examples of various bootstrap architectures for a half-bridge switching circuit.
Figure 3:
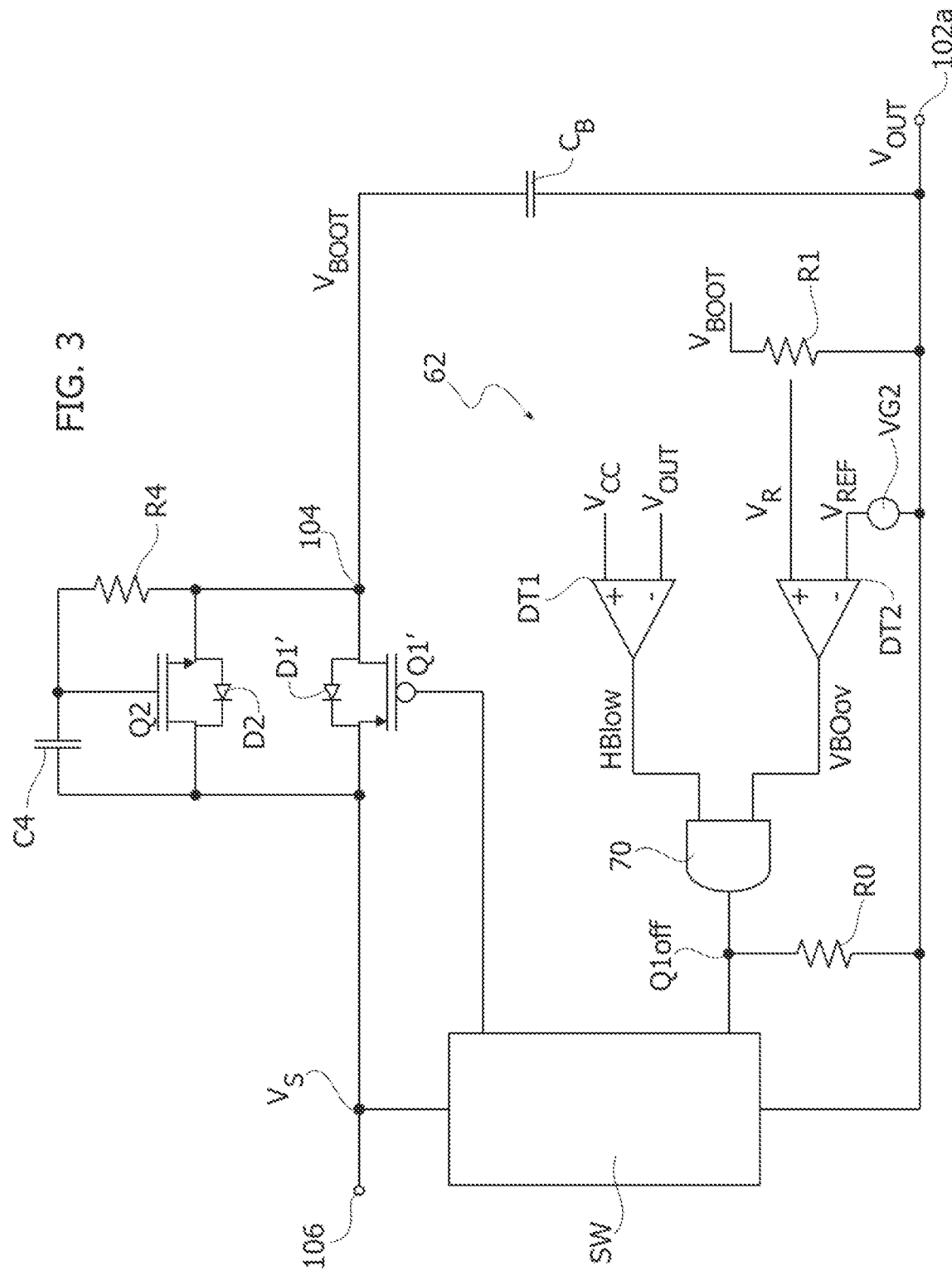
Figure 4:
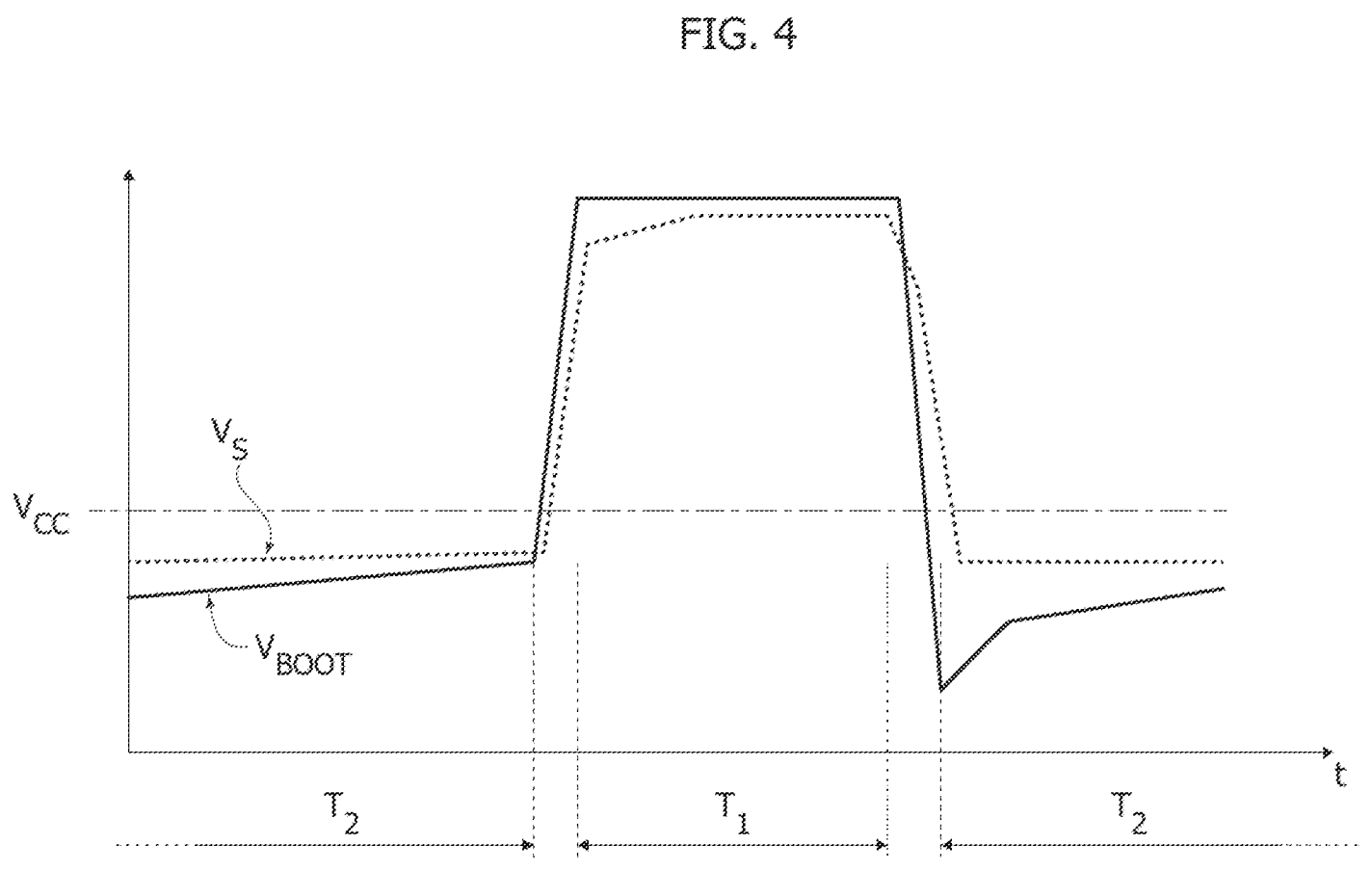
Figure 5:
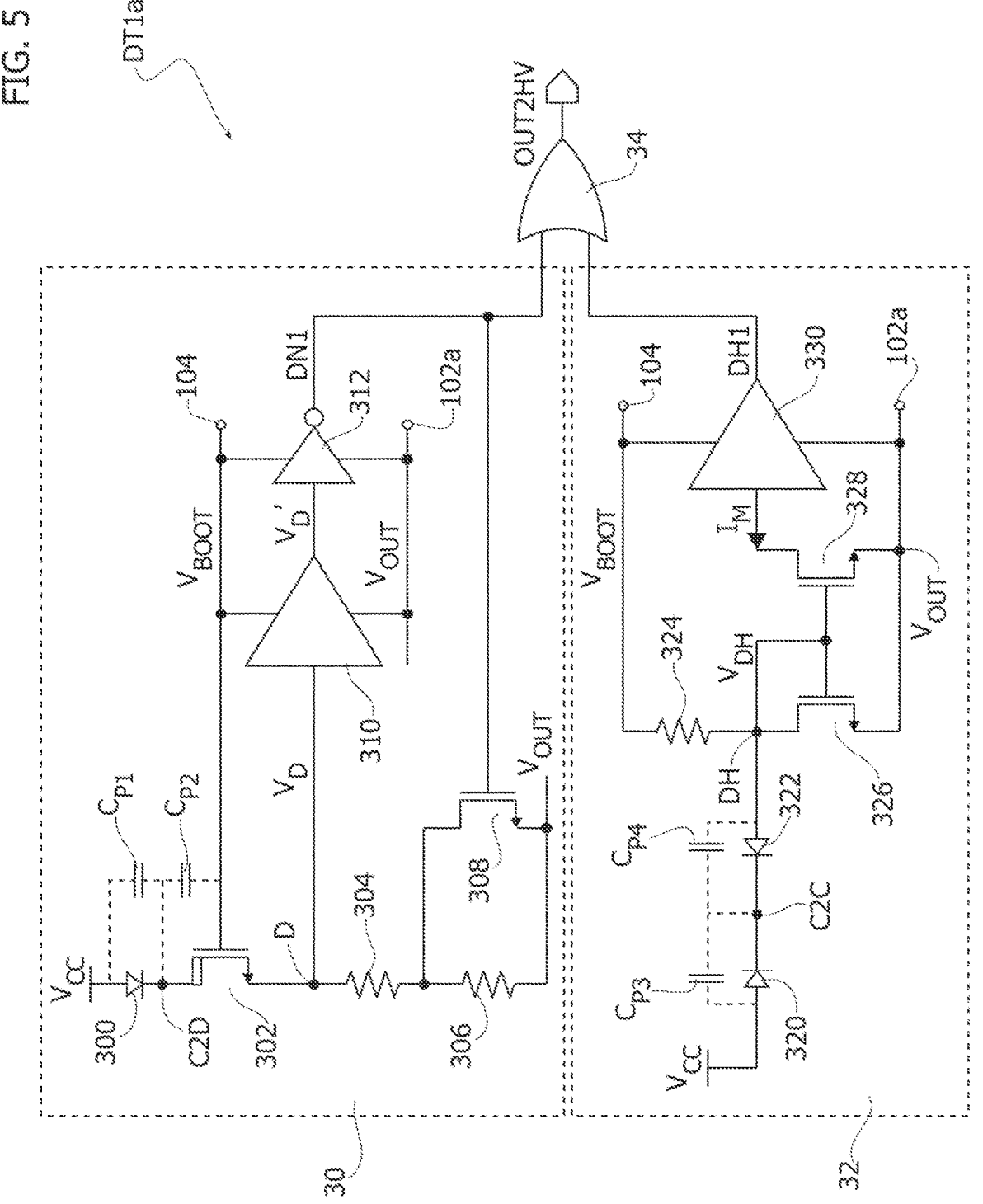
FIG. 5 shows a first embodiment of a detector circuit adapted to be used in the half-bridge switching circuits of FIGS. 2 and 3.
Figure 6:
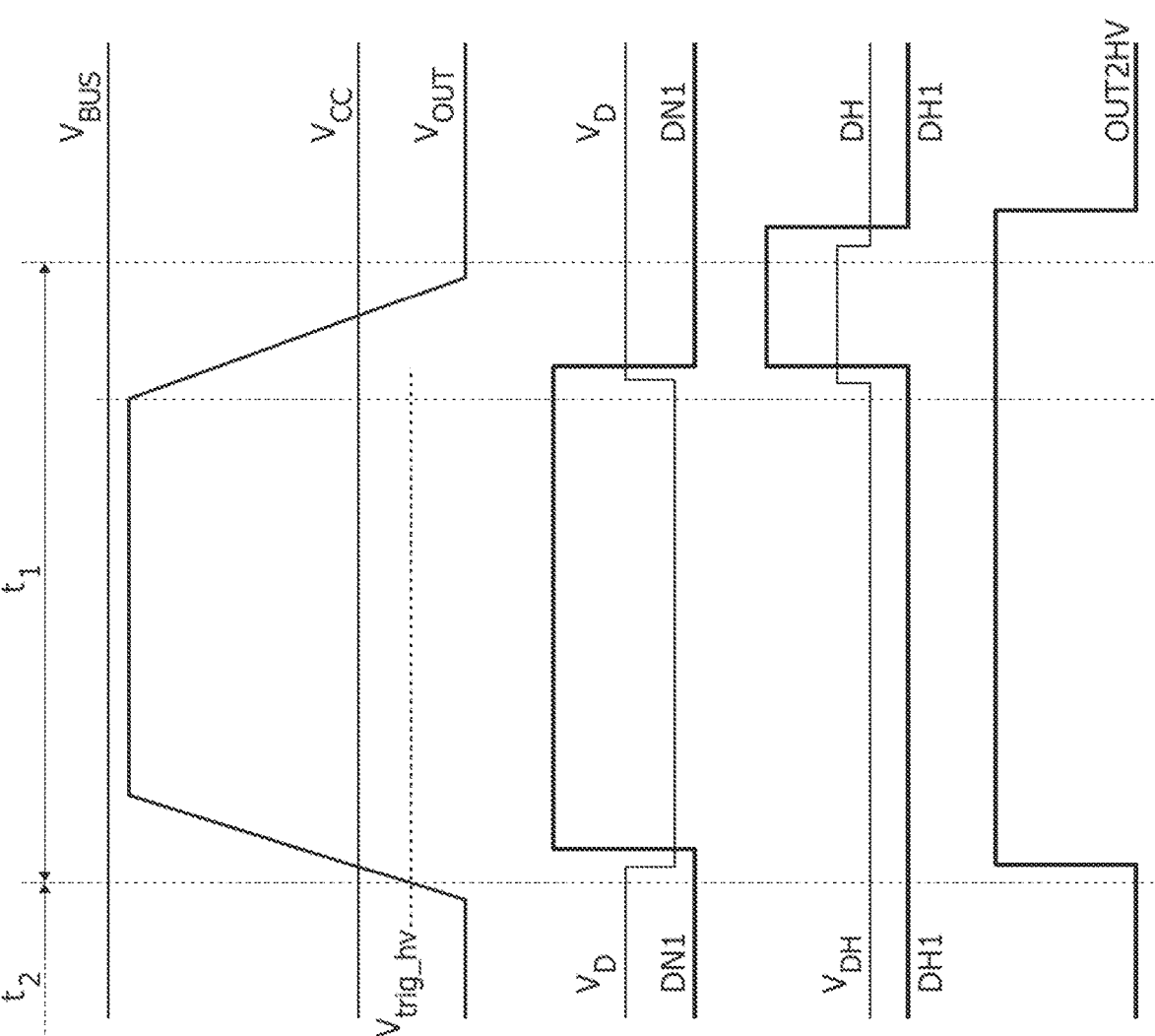
FIG. 6 shows possible waveforms of signals in the circuit of FIG. 5.
Figure 7:
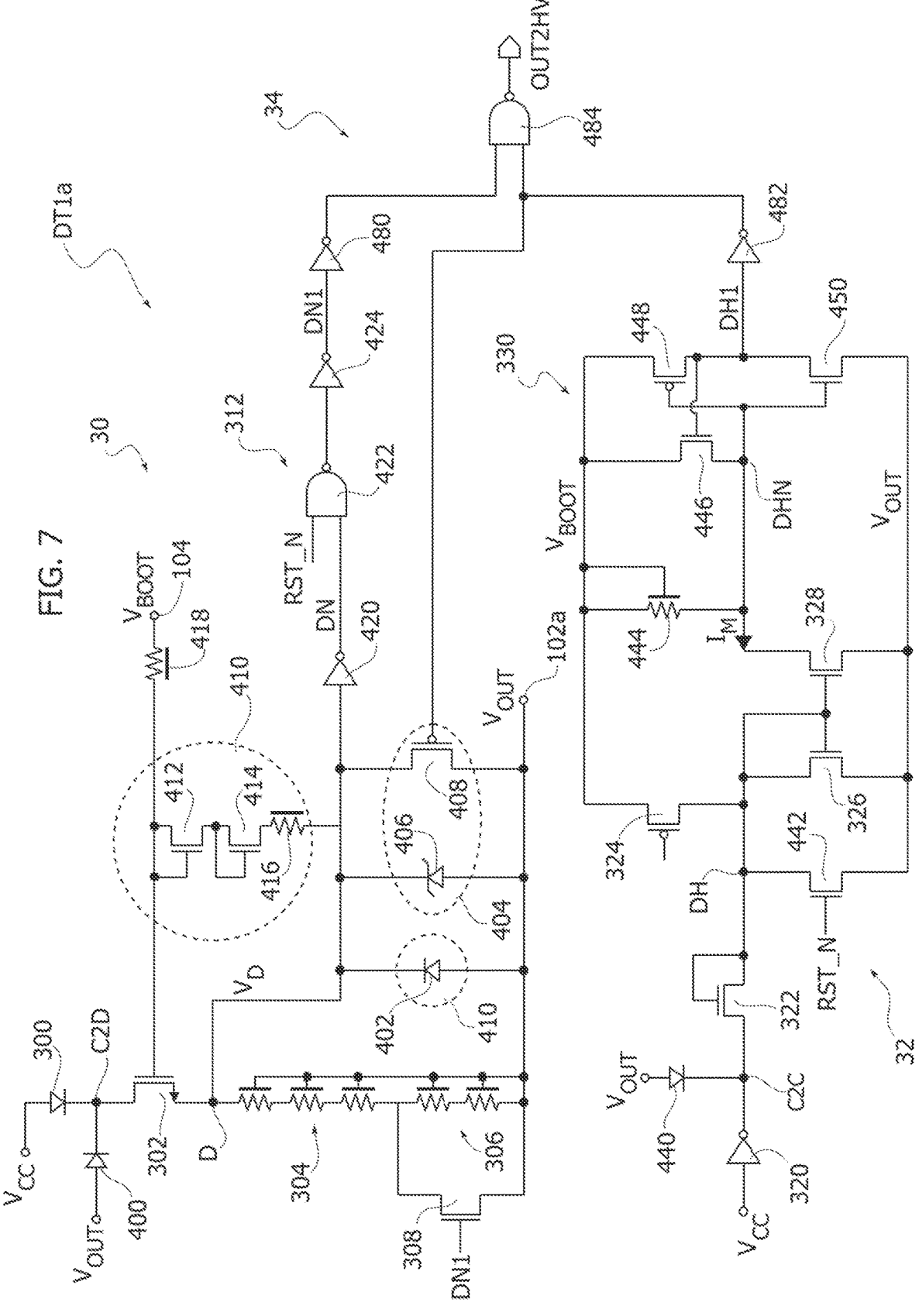
FIG. 7 shows a second embodiment of a detector circuit adapted to be used in the half-bridge switching circuits of FIGS. 2 and 3.

In FIGS. 5 to 7 described below, parts, elements or components that have already been described with reference to FIGS. 1 to 4 are designated by the same references used previously in these figures. The description of these elements has already been made and will not be repeated in what follows in order not to burden the present detailed description.

As mentioned before, various embodiments of the present disclosure relate to a floating level detector circuit. Specifically, such a detector circuit may be used in a half-bridge driver circuit in order to detect whether a voltage $V_{OUT}$ at the switching node 102a of a half-bridge circuit is below a threshold value or above the threshold value. In general, the voltage $V_{OUT}$ at the switching node 102a may be imposed via the electronic switches, or via the load impedance when both electronic switches HS and LS are opened.

FIG. 5 shows a first embodiment of a detector circuit DT1*a* according to the present disclosure.

Specifically, in the embodiment considered, a first terminal of the detector circuit DT1*a* is connected to terminal 102a and is thus configured to receive to the voltage $V_{OUT}$. As described in the foregoing, in various embodiments, the node 102a may be connected via a half-bridge arrangement comprising two electronic switches HS and LS to a voltage $V_{BUS}$ or a reference voltage/ground GND. Reference can be made to the previous description for this purpose, in particular the general architecture shown in FIG. 1.

Moreover, a second terminal is connected to terminal 102a and thus configured to receive the DC supply voltage $V_{CC}$. As mentioned before, the supply voltage $V_{CC}$ may be provided by any type of power supply PS and has usually a value between 3 and 20 V. Specifically, in various embodiments, the voltage $V_{CC}$ is smaller than the voltage $V_{BUS}$.

In the embodiment considered, the detector circuit DT1*a* comprises also a third terminal connected to terminal 104, whereby the third terminal is configured to receive a supply voltage $V_{BOOT}$. Specifically, in various embodiments, the detector circuit DT1*a* is arranged in the floating section FS, i.e., the detector circuit DT1*a* is supplied via a voltage $V_{CB} = V_{BOOT} - V_{OUT}$ being referred to the voltage $V_{OUT}$ at the terminal 102a, i.e., the voltage $V_{BOOT}$ is floating with the voltage $V_{OUT}$.

In various embodiments, the voltage $V_{BOOT}$ may be provided via a capacitor $C_B$ connected between the terminals 104 and 102a, wherein the capacitor $C_B$ is recharged via a bootstrap architecture. For example, in various embodiments, the capacitor $C_B$ is recharged via a charge circuit when the node 102a is connected via the electronic switch LS to the reference voltage/ground GND. Reference can be made to the previous description for a possible implementation of a charge circuit. For example, as described in the foregoing, the charge circuit may comprise a diode DB or an active diode circuit Q3/D3, and an optional current limiter circuit (Q1', D1' and 62).

For example, as described in the foregoing, the signal generated by the detector circuit DT1*a* may be used to control the operation of such a current limiter circuit. However, since the signal generated by the detector circuit DT1*a* indicates whether the voltage $V_{OUT}$ at the switching node 102a is above or below the voltage $V_{CC}$, the signal generated by the detector circuit DT1*a* may also be used for other purposes, and the control of the current limiter transistor Q1' is just an exemplary application. For example, the signal provided by the detector circuit DT1*a* may be used to activate a low power consumption state of one or more circuits in the floating section FS.

Generally, due to the fast variation of the voltage $V_{OUT}$, the detector circuit DT1*a* should be rather fast, e.g., the detection time should just introduce some nanoseconds of delay. Moreover, due to the variation of the switching node 102a between the voltages $V_{BUS}$ and the reference voltage/ground GND, the detector circuit DT1*a* should avoid stress or overcurrent in the components. Finally, since the detector circuit DT1*a* is arranged in the floating section FS, the detector circuit DT1*a* should have a low power consumption, especially when the high-side switch HS is closed, because in this case, the power is usually only provided by the storage capacitor $C_B$. While these are rather tough requirements for a comparator circuit, the inventors have observed that the precision of the detector circuit DT1*a* may instead be rather low, because the voltage $V_{BUS}$ is usually significantly greater than the voltage $V_{CC}$, e.g., the voltage $V_{BUS}$ is at least the double of the voltage $V_{CC}$.

Specifically, in the various embodiments, the detector circuit DT1*a* comprises a first circuit 30, which essentially implements a comparator, preferably a comparator with hysteresis. Specifically, in various embodiments, the terminal 100a/the voltage $V_{CC}$ is connected (e.g., directly) via a diode 300 to a node C2D. Specifically, the anode of the diode 300 is connected (e.g., directly) to the voltage $V_{CC}$ and the cathode of the diode 300 is connected (e.g., directly) to the node C2D.

In the embodiment considered, the node C2C is coupled to a first node D of a resistance, wherein the second node of the resistance is connected to terminal 102a, i.e., the voltage $V_{OUT}$. For example, in various embodiments the resistance is implemented with a series connection of at least two resistors/resistances 304 and 306, wherein a first terminal of the resistance 304 is connected to the node D and a second terminal of the resistance 304 is connected via the resistance 306 to the terminal 102a. For example, as shown in FIG. 7, each of the resistances 304 and 306 may be implemented with one or more resistive elements, e.g., provided in an integrated circuit comprising the detector circuit DT1*a*, and possibly also other circuits to implement an integrated half-bridge driver circuit HBD.

Accordingly, when the voltage $V_{OUT}$ (plus the threshold voltage of the diode 300) is smaller than the voltage $V_{CC}$, a current flows through the resistance 304/306, whereby a voltage $V_D$ is generated at the resistance 304/306, i.e., between the nodes D and 102a. Since the resistances 304/306 are connected to the terminal 102a/the voltage $V_{OUT}$, also the voltage $V_D$ is referred to the voltage $V_{OUT}$.

Accordingly, in the embodiment considered, the circuit 30 comprises a comparison circuit 312 configured to assert a comparison signal DN1 when the voltage $V_D$ exceeds a threshold voltage. Specifically, in various embodiments, the comparison circuit is supplied by the voltage $V_{CB} = V_{BOOT} - V_{OUT}$ and the comparison signal DN1 is referred to the voltage $V_{OUT}$.

For example, in the embodiment considered, the comparison circuit 312 is implemented with an (digital) inverter (i.e., a NOT gate) supplied by the voltage $V_{CB}$, i.e., a positive supply terminal of the inverter 312 is connected to the terminal 104/the voltage $V_{BOOT}$ and a negative supply terminal of the inverter 312 is connected to the terminal 102a/the voltage $V_{OUT}$. Accordingly, in this case, the inverter 312 asserts the signal DN1 by setting the signal DN1 to low when the voltage $V_D$ exceeds the input threshold voltage of the inverter 312. Similarly, the inverter 312 de-asserts the signal DN1 by setting the signal DN1 to high when the voltage $V_D$ falls below the input threshold voltage of the inverter 312.

In general, the inverter 312 may also be replaced with other logic gates supplied by the voltage $V_{CB}$. For example, in various embodiments, comparison circuit 312 comprises a series connection of two or more inverters. Additionally, or alternatively, comparison circuit 312 may comprise also other logic gates, such as AND, OR, NAND or NOR gates. For example, FIG. 7 shows an embodiment wherein the comparison circuit 312 comprises a first inverter 420 configured to set a signal DN to low when the voltage $V_D$ exceeds the input threshold voltage of the inverter 420. Similarly, the inverter 420 sets the signal DN to high when the voltage $V_D$ falls below the input threshold voltage of the inverter 312.

In various embodiments, the comparison circuit 312 comprises or has associated a logic gate 422 configured to selectively enable the comparison circuit 312 by generating a signal by combining the signal DN with a signal RST_N, such as a reset signal. Accordingly, in the embodiment considered, the signal RST_N may be used to disable or enable the comparison circuit 312. For example, logic gate 422 may be a AND gate, which directly provides the signal DN1. Alternatively, logic gate 422 may be a NAND gate and an additional inverter 424 may be used to generate the signal DN1 by inverting the signal at the output of the NAND 422.

In various embodiments, the comparison circuit 312 has also associated (e.g., comprises) an amplifier stage 310 configured to generate a voltage $V_D'$ by amplifying the voltage $V_D$. Specifically, in the embodiment considered, also the amplifier stage 310 is supplied by the voltage $V_{CB}$ and the voltage $V_D'$ is referred to the voltage $V_{OUT}$. For example, in this case, the inverter 312 may receive at input the voltage $V_D'$ (and not the voltage $V_D$).

In various embodiments, in order to implement a comparator with hysteresis, the value of the resistance 304/306 may by varied as a function of the signal DN1, in particular in order to reduce the resistance when the signal DN1 is de-asserted (when the voltage VD is smaller than the threshold value) and increase the resistance when the signal DN1 is asserted (when the voltage VD is smaller than the threshold value). For example, when using a series connection of at least two resistances 304 and 306, circuit 30 may comprise an electronic switch 308 configured to short circuit one of the resistances 304 and 306 when the signal DN1 is de-asserted. More specifically, in the embodiments shown in FIGS. 5 and 7, the electronic switch 308 is implemented with an n-channel FET, wherein the source terminal of the FET 308 is connected (e.g., directly) to the terminal 102a/ the voltage $V_{OUT}$, the drain terminal of the FET 308 is connected (e.g., directly) to the intermediate node between the resistance 304 and 306 (where the resistance 306 is connected between the resistance 304 and the terminal 102a) and the gate terminal of the FET 308 is connected to the signal DN1, i.e., the output of the comparison circuit 312. Accordingly, in the embodiment considered, the electronic switch 308 is configured to:

in response to determining the signal DN1 is de-asserted (e.g., is set to high), close the electronic switch 308 (short-circuit the resistance 306); and in response to determining the signal DN1 is asserted (e.g., is set to low), open the electronic switch 308 (not short-circuit the resistance 306).

Thus, in the embodiment considered, the resistances 304 and 306, and the electronic switch 308 implement a variable resistance, wherein the variable resistance has a first value when the signal DN1 is asserted (e.g., is set to low) and a second value when the signal DN1 is de-asserted (e.g., is set to high), wherein the second value is smaller than the first value.

In various embodiments, the circuit 30 comprises a FET 302, wherein the current path of the electronic switch 302 is connected between the diode 300 and the resistance 304/306. For example, in the embodiment considered, the electronic switch 302 is a n-channel FET, wherein the drain terminal of the FET 302 is connected (e.g., directly) to the node C2D and the source terminal of the FET 302 is connected (e.g., directly) to the node D. Specifically, in the embodiment considered, the gate terminal of the FET 302 is connected (e.g., directly) to the terminal 104/the voltage $V_{BOOT}$.

Specifically, in the embodiment considered, the transistor 302 implements a cascode and pull-up. Specifically, the transistor 302 is of the high-voltage (HV) category, allowing integrity and functionality in case of a high drain-source and drain-gate voltage. In fact, during the recirculation portion of the recharge phase (i.e., the initial portion of $T_2$ in FIG. 4) the voltage $V_{OUT}$ at the node 102a is expected to fall below 0V. Thus, without the transistor 302, the note C2D would be connected to the node D, and a voltage $V_D$ may be generated at the node D, which may be destructive due to the low threshold and low impedance of the direct-driven diode 300.

Accordingly, as shown in FIG. 6, once the electronic switch LS is opened and the electronic switch HS is closed, the voltage $V_{OUT}$ increases and the voltage $V_D$ decreases. (in absolute values, i.e., the voltage difference between the nodes D and 102a decreases). In this respect, once the voltage $V_{OUT}$ exceeds a given threshold value $V_{trig\_hv}$ the comparator circuit 312 triggers and de-asserts the signal DN1, e.g., the inverter 312 sets the signal DN1 to high. As mentioned before, the signal DN1 may also be used to vary the value of the resistance 304/306.

As shown in FIG. 5, indeed the node C2D is coupled to the node 100a/the voltage $V_{CC}$ via a first capacitance $C_{P1}$ (connected in parallel with the diode 300) and to the node 106/the voltage $V_{BOOT}$ via a second capacitance $C_{P2}$ (connected between the drain terminal and gate terminal of the FET 302). Specifically, in various embodiments, these capacitances are given only by the (parasitic) capacitance associated to the semiconductor components, because additional oxide-based capacitor may not be able to sustain a HV at its electrodes. Thus, the capacitors indicated by the dotted lines in FIG. 5 may refer to the junction capacitance associated to the components.

In this respect, the inventors have observed that the circuit 30 is able to detect the transition from the LV phase ($T_1$) to the HV phase ($T_2$) quickly after the rising edge of the voltage $V_{OUT}$, because the node C2D represents a "decoupling node" that is capacitively tied a fixed voltage $V_{CC}$ representing a "conceptual ground," which permits to pull-down the voltage $V_D$, in parallel to the "pull-down" resistance 304/306.

However, the inventors have observed that the circuit 30 may not always be able to correctly signal the HV phase ($T_2$) during a falling edge of the voltage $V_{OUT}$ once the electronic switch HS is opened and the electronic switch LS is closed. In fact, in this case, the capacitive coupling at the node C2D operates now rather as a pull-up for the voltage $V_D$, whereby the voltage $V_D$ increases to early and the comparator circuit

312 triggers and asserts the signal DN1, e.g., the inverter 312 sets the signal DN1 to low. Accordingly, in case of fast negative variations of the voltage $V_{OUT}$ with a high rate $dV_{OUT}/dt$, the circuit 30 may signal a false HV off-phase.

Accordingly, in various embodiments, the detector circuit DT1$a$ comprises a second circuit 32 configured to detect a negative transition of the voltage $V_{OUT}$.

For example, in the embodiment considered, the circuit 32 comprises two diodes 320 and 322 connected in series. Specifically, the anode of the diode 320 is connected (e.g., directly) to the terminal 100$a$/the voltage $V_{CC}$, the cathode of the diode 320 is connected (e.g., directly) to a node C2C, the anode of the diode 322 is connected (e.g., directly) to a node DH and the cathode of the diode 322 is connected (e.g., directly) to the node C2C. For example, as shown in FIG. 7 at the example of the diode 322, the diode may also be implemented with a FET, such as a n-channel FET.

Accordingly, also in this case, the diode 320 has associated a capacitance $C_{P3}$ connected between the cathode and anode of the diode 320 and the diode 322 has associated a capacitance $C_{P4}$ connected between the cathode and anode of the diode 322. Typically, these capacitances are the parasitic capacitances of the diodes. For example, the diodes 320 and 322 may be large to generate greater parasitic capacitances $C_{P3}$ and $C_{P4}$.

In the embodiment considered, the node DH is coupled to the terminal 102$a$/the voltage $V_{OUT}$. Accordingly, in the embodiment considered, in case of a negative transition of the voltage $V_{OUT}$, i.e., the voltage $V_{OUT}$ decreases, the capacitive coupling at the node C2C injects a current in the node DH.

For example, in the embodiment considered, the circuit 32 is configured to measure this current injected in the node DH. For example, for this purpose, the node DH is coupled to terminal 102$a$ via an input transistor of a current mirror. For example, in the embodiment considered, the current mirror is implemented with an input FET 326 and an output FET 328. For example, when using n-channel FETs, the source terminal of the FET 326 and the source terminal of the FET 328 are connected (e.g., directly) to the terminal 102$a$/the voltage $V_{OUT}$, the gate terminal of the FET 326 is connected (e.g., directly) to the drain terminal of the FET 326 and the gate terminal of the FET 328 is connected (e.g., directly) to the gate terminal of the FET 326. Accordingly, in the embodiment considered, the drain terminal of the FET 326 is coupled (e.g., connected directly) to the node DH.

In various embodiments, the input transistor 326 of the current mirror may also have associated a bias circuit 324. For example, in the embodiment shown in FIG. 5, the bias circuit 234 is implemented with a resistance connected (e.g., directly) between the terminal 104/the voltage $V_{BOOT}$ and the node DH. In general, the resistance 324 may also be replaced with a current source. For example, in FIG. 7 is used a FET 324, such as a p-channel FET, wherein the current-path of the FET 324 is connected between the nodes 104 and DH, and the gate terminal may be disconnected, thus essentially implementing a resistor because the FET 324 is working in the triode region, or may be connected to an appropriate gate-source voltage in order to current (leakage) source.

Conversely, in the embodiment shown in FIG. 7, the bias circuit 234 is implemented with a FET, such as a p-channel FET, having its current path connected between the terminal 104/the voltage $V_{BOOT}$ and the node DH.

Accordingly, in the embodiment considered, the output transistor 328 of the current mirror provides a current $I_M$, which is indicative of the charge injected by the node C2C via the capacitances CP3 and CP4 into the node DH in case of a negative transition of the voltage $V_{OUT}$.

Accordingly, in the embodiment considered, the current $I_M$ provided by the output transistor 328 of the current mirror may be fed to a comparison circuit 330 configured to generate a binary signal DH1, wherein the comparison circuit 330 asserts the signal DH1, e.g., sets the signal DH1 to high, when the current $I_M$ is greater than a given threshold and de-asserts the signal DH1, e.g., sets the signal DH1 to low, when the current $I_M$ is smaller than the given threshold. Specifically, in the embodiment considered, the comparison circuit 330 is supplied by the voltage $V_{CB}=V_{BOOT}-V_{OUT}$, and the signal DH1 is referred to the voltage $V_{OUT}$.

For example, for this purpose, the comparison circuit 330 may have associated (e.g., may comprise) a current to voltage conversion circuit configured to generate a voltage being indicative of (and preferably proportional to) the value of the current I. For example, in the embodiment shown in FIG. 7, the current to voltage conversion is implemented with a resistive element 444, wherein the circuit 330 is configured to flow the current $I_M$ through the resistive element 444. For example, in the embodiment considered, the resistive element 444 is connected between the drain terminal of the FET 328, indicated in the following also as node DHN, and the terminal 104/the voltage $V_{BOOT}$. Accordingly, in the embodiment considered, when the current $I_M$ increases, also the voltage drop at the resistive element 444 increases. For example, in the embodiment considered, this implies that the voltage between the drain and source terminals of the FET 328 decreases.

Accordingly, in various embodiments, the comparator circuit 330 may be configured to monitor the voltage at the resistive element 444 or the voltage drop between the drain and source terminals of the FET 328, i.e., the voltage at the node DHN. For example, similar to the circuit 30, in the embodiment considered, the comparison circuit 330 is implemented with an inverter having an input connected to the node DHN.

FIG. 7 also shows a possible implementation of such an inverter, which may be used for any of the inverters mentioned before. Specifically, in the embodiment considered, an input terminal of the inverter, i.e., the node DHN, is connected to the gate terminal of a p-channel FET 448 and the gate terminal of a n-channel FET 450, the source terminal of the p-channel FET 448 is connected to the voltage $V_{BOOT}$, the source terminal of the n-channel FET 450 is connected to the voltage $V_{OUT}$ and the drain terminals of the p-channel FET 448 and the n-channel FET 450 are connected to an output terminal of the inverter.

As shown in FIG. 6, a charge is injected into the node DH only during the transition of the voltage $V_{OUT}$. Conversely, when the voltage $V_{OUT}$ remains stable, no charge is injected. In various embodiments, the circuit 32 may be configured to monitor only negative transitions of the voltage $V_{OUT}$, which may e.g., ensured when using a current mirror 326/328 with n-channel FETs.

Accordingly, in the embodiment considered, the circuit 32 is configured to assert the signal DH1 in response to detecting a negative variation/transition of the voltage $V_{OUT}$. Accordingly, as shown in FIG. 6, to correctly detect the HV phase ($T_1$), the detector circuit DT1$a$ may be configured to generate a signal OUT2HV, which is asserted when at least one of the signals DN1 or DH1 is asserted. For example, as shown in FIG. 5, in various embodiments, the detector circuit DT1$a$ comprises a logic gate, such as an OR gate, configured to:

assert the signal OUT2HV in response to determining that the signal DN1 is asserted or the signal DH1 is asserted; and de-assert the signal OUT2HV in response to determining that the signal DN1 is de-asserted and the signal DH1 is de-asserted.

FIG. 7 shows in this respect an alternative embodiment, wherein the OR gate 34 has been replaced with a NAND gate 484 and two inverters 480 and 482.

FIG. 7 also shows further possible improvements of the basic circuit shown in FIG. 5. In general, these improvements are purely optional, and may be used individually or in combination.

Specifically, according to the first aspect, each of the nodes C2C and C2C may be connected via a respective diode 400 and 440 to the voltage $V_{OUT}$. For example, the cathode of the diode 400 may be connected to the node C2D and the anode of the diode 400 may be connected to the voltage $V_{OUT}$. Similarly, the cathode of the diode 440 may be connected to the node C2C and the anode of the diode 440 may be connected to the voltage $V_{OUT}$. Such diodes permit the limit of the voltage stress at the nodes C2C and C2D. Specifically, the diodes 400 and 440 operate during the rising phase of the voltage $V_{OUT}$, where a high current may be drained from nodes D and DH creating possible voltage stresses. Conversely, the diodes 400 and 440 keep the voltages at the nodes C2D and C2C close to the voltage $V_{OUT}$.

According to a second aspect, the input node D of the comparison circuit 312, i.e., the voltage $V_D$, may have been associated one or more voltage stress limiter circuits 410 and/or 404.

Specifically, in various embodiments, the voltage stress limiter circuit 410 comprises a diode 402, wherein the cathode of the diode 402 is connected to the input node D of the comparison circuit 312 and the anode of the diode 402 is connected to the voltage $V_{OUT}$.

In various embodiments, the input node D of the comparison circuit 312 may also be coupled to the voltage $V_{BOOT}$ via a diode 412. Specifically, in various embodiments, the anode of the diode 412 is connected to the voltage $V_{BOOT}$ and the cathode of the diode 412 is connected via a resistance 416 to the input terminal of the comparison circuit 312. In general, the diodes 412 and 402 may also be implemented with a series connection of a plurality of diodes (as shown schematically via a diode 414). Moreover, one or more of the diodes 402, 412 and 414 may be implemented with a FET.

Moreover, instead of directly connecting the gate terminal of the FET 302 and the anode of the diode 412 to the voltage $V_{BOOT}$, the stress limiter circuit 410 comprises a resistance 418 connected between the anode of the diode 412 and the terminal 104, and the gate terminal of the FET 302 may be connected to the anode of the diode 412.

Substantially, the voltage limiter circuit 410 is configured to limit the voltage $V_D$, in case of transitions of the voltage $V_{OUT}$ and the voltage $V_D$ is smaller than the voltage $V_{OUT}$, i.e., in case of positive transitions of the voltage $V_{OUT}$. Moreover, the components 412 (and 414) and 416 (and 418) provide current only when the voltage $V_D$ falls close to or below the voltage $V_{OUT}$, thereby limiting the voltage at the gate terminal of the FET 302 by draining current from the voltage supply provided to the gate terminal.

Conversely, the voltage stress limiter circuit 404 may comprise a Zener diode 406 connected between the node D/the voltage $V_D$ and the voltage $V_{OUT}$, wherein the cathode of the diode 406 is connected to the input terminal D of the comparison circuit 312 and the anode of the diode 406 is connected to the terminal 102a. Substantially, the voltage limiter circuit 404 is configured to limit the voltage $V_D$, in case the voltage $V_D$ overcomes the voltage $V_{OUT}$ by the breakdown voltage of the Zener diode 406, in particular in case of negative transitions of the voltage $V_{OUT}$. Specifically, the Zener diode 406 should be dimensioned to have a threshold voltage being greater than the voltage $V_{trig\_hv}$, whereby the Zener diode draws current when the voltage $V_D$ is (well) above the threshold $V_{trig\_hv}$.

In addition to or as an alternative to the Zener diode 406, the voltage $V_D$ may also be limited via a current limiter FET 408. For example, in the embodiment considered, the current limiter 408 is implemented with a p-channel FET, such as a PMOS, (having its current path) connected between the terminal D and the terminal 102a, wherein the gate terminal of the p-channel FET 408 is driven by the inverted version of the signal DH1. Accordingly, in the embodiment considered, when the signal DH1 is low, i.e., when no negative transition is detected and the gate terminal of the FET 408 is set to high, the FET 408 is opened when the gate-source voltage of the FET 408 exceeds a given threshold, whereby the FET 408 drain current, thereby limiting the voltage $V_D$ with respect to the voltage at the gate terminal of the FET 408. Accordingly, the FET 408 permits to limiting the dynamics of voltage $V_D$ in case of a negative transition of the voltage $V_{OUT}$.

According to a third aspect, the comparison circuit 330 may also comprise a limiter circuit for the inverter 448/450. Specifically, in the embodiments considered, (the current path of) a n-channel FET 446, such as a NMOS, is connected between the nodes 104 and DHN, and the gate terminal of the FET 446 is connected to the node DH1. Specifically, this FET 446 permits to keep the voltage at the node DHN, i.e., the input terminal of the inverter 448/450 close to the "trigger point" of the inverter, thereby reducing the time response of the comparison circuit. Specifically, without the FET 446, the voltage at the node DHN could fall very close to the voltage $V_{OUT}$ during the detection of a negative transition of the voltage $V_{OUT}$. This is due to the high gain of the current to voltage conversion stage 328/444. However, as soon the falling transient of the voltage $V_{OUT}$ ends, a quick response to the bootstrap path should be given to avoid any overshoot of the voltage $V_{CB}$. In this respect, the FET 446 acts as a limiter of the "downfall" of the voltage at the node DHN, i.e., the input of inverter 448/450, without interfering with the operation of the inverter 448/450, because the FET 446 is switched on only once the signal DH1 has been already "triggered high."

Finally, according to a fourth aspect, also the circuit 32 may be reset or enabled as a function of the signal RST_N. For example, in the embodiment considered, the circuit 32 comprises an electronic switch 442, such as a n-channel FET, (having its current path) connected between the node DH and the terminal 102a, wherein the control terminal of the electronic switch 442 is driven via the signal RST_N.

Of course, without prejudice to the principle of the disclosure, the details of construction and the embodiments may vary widely with respect to what has been described and illustrated herein purely by way of example, without thereby departing from the scope of the present disclosure, as defined by the ensuing claims.

A half-bridge driver circuit (HBD) configured to drive a half-bridge including a high-side electronic switch (HS) and a low-side electronic switch (LS) connected between a supply voltage ($V_{BUS}$) and a reference voltage (GND), wherein said half-bridge driver circuit (HBD) may be summarized as including a first node (102a) configured to be connected to an intermediate node between said high-side electronic switch (HS) and said low-side electronic switch (LS), the voltage at said first node representing a floating reference voltage ($V_{OUT}$); a second node (104) configured to be connected via a capacitor ($C_B$) to said first node (102a); a positive (100a) and a negative (100b, 102b) power supply terminal for receiving a further supply voltage ($V_{CC}$); a charge circuit (DB; D3, Q3, Q1', D1') configured to provide a charge current to said second node (104) when the voltage ($V_{BOOT}$) at said second node (104) is smaller than said further supply voltage ($V_{CC}$), whereby said second node (104) provides a floating supply voltage ($V_{CB}$) being floating with said floating reference voltage ($V_{OUT}$) at said first node (102a); a high-side driver (12a) configured to drive a control terminal of said high-side electronic switch (HS) of said half-bridge, wherein said high-side driver (12a) is supplied by said floating supply voltage ($V_{CB}$); a low-side driver (12b) configured to drive a control terminal of said low-side electronic switch (LS) of said half-bridge, wherein said low-side driver (12b) is supplied by said further supply voltage ($V_{CC}$); a detector circuit (DT1; DT1a) configured to generate a signal (HBlow; OUT2HV) indicating whether said floating reference voltage ($V_{OUT}$) at said first node (102a) is greater than said further supply voltage ($V_{CC}$); wherein said detector circuit (DT1a) may be summarized as including a) a first circuit (30) including a first diode (300) having an anode connected to said further supply voltage ($V_{CC}$) and a cathode connected to a first decoupling node (C2D), wherein a first parasitic capacitance ($C_{P1}$) is associated with said first diode (300); a resistance (304, 306) having a first terminal (D) coupled to said first decoupling node (C2D) and a second terminal connected to said floating reference voltage ($V_{OUT}$); a first comparator circuit (312) configure to monitor a voltage drop ($V_D$) at said resistance (304; 306), wherein: in response to determining that said monitored voltage drop ($V_D$) is smaller than a first threshold, set a first control signal (DN1) to a respective first logic level; and in response to determining that said monitored voltage drop ($V_D$) is greater than said first threshold, set said first control signal (DN1) to a respective second logic level; b) a second circuit (32) including a current mirror comprising an input transistor (326) and an output transistor (328); a second diode (320) having an anode connected to said further supply voltage ($V_{CC}$) and a cathode connected to a second decoupling node (C2C), wherein a second parasitic capacitance ($C_{P3}$) is associated with said second diode (320); a third diode (322) having a cathode connected to said second decoupling node (C2C) and an anode (DH) connected via the input transistor (326) of said current mirror to said floating reference voltage ($V_{OUT}$), wherein a third parasitic capacitance ($C_{P4}$) is associated with said third diode (322); a second comparator circuit (330) configure to monitor a current ($I_M$) provided by the output transistor (328) of said current mirror, wherein in response to determining that said monitored current ($I_M$) is greater than a second threshold, set a second control signal (DH1) to a respective first logic level, and in response to determining that said monitored current ($I_M$) is smaller than said second threshold, set said second control signal (DH1) to a respective second logic level; and c) a combinational logic circuit (34) configured to: assert said signal (HBlow; OUT2HV) in response to determining that said first control signal (DN1) has the respective first logic level or said second control signal (DH1) has the respective first logic level, and deassert said signal (HBlow; OUT2HV) in response to determining that said first control signal (DN1) has the respective second logic level and said second control signal (DH1) has the respective second logic level.

Said resistance (304, 306) may be switchable between a first resistance value (304, 306) and a second resistance value (304), wherein said second resistance value (304) may be smaller than said first resistance value (304, 306), and wherein said first circuit (30) is configured (308) to: in response to detecting that said first control signal (DN1) is set to said first logic level, activate said second resistance value (304) of said resistance; and in response to detecting that said first control signal (DN1) is set to said second logic level, activate said first resistance value (304, 306) of said resistance.

Said resistance (304, 306) may include a series connection of a first resistance (304) and a second resistance (306), wherein said first circuit (30) may include an electronic switch (308) configured to short-circuit said second resistance (306) in response to detecting that said first control signal (DN1) may be set to said first logic level.

Said first circuit (30) may include a first n-channel FET (302), wherein a drain terminal of said first n-channel FET (302) may be connected to said first decoupling node (C2D), a source terminal of said first n-channel FET (302) may be connected to said first terminal (D) of said resistance (304, 306) and a gate terminal of said first n-channel FET (302) may be coupled to said second node (104).

The gate terminal of said first n-channel FET (302) may be connected via a first current limiter resistance (418) to said second node (104), and wherein the gate terminal of said first n-channel FET (302) may be connected via a fourth diode (412, 414) and a second current limiter resistance (416) to said first terminal (D) of said resistance (304, 306).

The half-bridge driver circuit (HBD) may include at least one of: a first clamping diode (402), wherein the anode of said first clamping diode (402) is connected to said floating reference voltage ($V_{OUT}$) and the cathode of said first clamping diode (402) is connected to said first terminal (D) of said resistance (304, 306); a second clamping diode (400), wherein the anode of said second clamping diode (400) is connected to said floating reference voltage ($V_{OUT}$) and the cathode of said second clamping diode (400) is connected to said first decoupling node (C2D); and a third clamping diode (440), wherein the anode of said third clamping diode (440) is connected to said floating reference voltage ($V_{OUT}$) and the cathode of said second clamping diode (440) is connected to said second decoupling node (C2C).

Said first comparator circuit (312) may include a first inverter (420) configured to: in response to determining that said monitored voltage drop ($V_D$) is smaller than said first threshold, set said first control signal (DN1) to high, and in response to determining that said monitored voltage drop ($V_D$) is greater than said first threshold, set said first control signal (DN1) to low; wherein said second comparator circuit (330) comprises a second inverter (448, 450) configured to: in response to determining that said monitored current ($I_M$) is greater than said second threshold, set said second control signal (DH1) to high, and in response to determining that said monitored current ($I_M$) is smaller than said second threshold, set said second control signal (DH1) to low.

Said second comparator circuit (330) may include a current-to-voltage conversion circuit (444) including a current-to-voltage conversion resistance (444) connected between said output transistor (328) of said current mirror and said second node (104).

The half-bridge driver circuit (HBD) may include a Zener diode (406), wherein the anode of said Zener diode (406) is connected to said floating reference voltage ($V_{OUT}$) and the cathode of said Zener diode (406) is connected to said first terminal (D) of said resistance (304, 306); and/or a voltage-limiter FET (408), wherein said voltage-limiter FET (408) is a p-channel FET having a drain terminal connected to said floating reference voltage ($V_{OUT}$), a source terminal connected to said first terminal (D) of said resistance (304, 306) and a gate terminal connected to the inverted version of said second control signal (DH1).

Said second circuit (32) may include a bias circuit (324) connected between the anode (DH) of said third diode (322) and said second node (104).

An integrated circuit may include a half-bridge driver circuit (HBD).

A half-bridge switching circuit may be summarized as including a half-bridge driver circuit (HBD) according to any of the previous claims; a high-side electronic switch (HS) and a low-side electronic switch (LS) connected between a supply voltage ($V_{BUS}$) and a reference voltage (GND), wherein the first node (102a) of said half-bridge driver circuit (HBD) is connected to an intermediate node between said high-side electronic switch (HS) and said low-side electronic switch (LS); and a capacitor ($C_B$) connected between the first node (102a) of said half-bridge driver circuit (HBD) and the second node (104) of said half-bridge driver circuit (HBD).

A method of operating a half-bridge switching circuit may be summarized as including applying the supply voltage ($V_{BUS}$) to said high-side electronic switch (HS) and said low-side electronic switch (LS), and the further supply voltage ($V_{CC}$) to said half-bridge driver circuit (HBD); providing via the charge circuit (DB; D3, Q3, Q1', D1') of said half-bridge driver circuit (HBD) a charge current to said second node (104) when the voltage ($V_{BOOT}$) at the second node (104) of said half-bridge driver circuit (HBD) is smaller than said further supply voltage ($V_{CC}$), whereby said second node (104) of the half-bridge driver circuit (HBD) provides a floating supply voltage ($V_{CB}$) being floating with the floating reference voltage ($V_{OUT}$) at the intermediate node between said high-side electronic switch (HS) and said low-side electronic switch (LS);-driving via the high-side driver (12a) of said half-bridge driver circuit (HBD) a control terminal of said high-side electronic switch (HS); driving via the low-side driver (12b) of said half-bridge driver circuit (HBD) a control terminal of said low-side electronic switch (LS); and generating via the detector circuit (DT1; DT1a) of said half-bridge driver circuit (HBD) a signal (HBlow; OUT2HV) indicating whether said floating reference voltage ($V_{OUT}$) at the intermediate node between said high-side electronic switch (HS) and said low-side electronic switch (LS) is greater than said further supply voltage ($V_{CC}$).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A half-bridge driver circuit, comprising:
a first node configured to be coupled to an intermediate node between a high-side electronic switch and a low-side electronic switch of a half-bridge driven by the half-bridge driver circuit, the high-side electronic switch being coupled to receive a first supply voltage and the low-side electronic switch being coupled to receive a reference voltage, a voltage at the first node representing a floating reference voltage;
a second node configured to be coupled via a capacitor to the first node;
positive and negative power supply terminals for receiving a second supply voltage;
a charge circuit configured to provide a charge current to the second node in response to a voltage at the second node being smaller than the second supply voltage, wherein the second node provides a floating supply voltage that is floating with the floating reference voltage at the first node;
a high-side driver configured to drive a control terminal of the high-side electronic switch, wherein the high-side driver is supplied by the floating supply voltage;
a low-side driver configured to drive a control terminal of the low-side electronic switch, wherein the low-side driver is supplied by the second supply voltage; and
a detector circuit configured to generate a signal indicating whether the floating reference voltage at the first node is greater than the second supply voltage, wherein the detector circuit includes a first circuit including:
a resistance coupled between the second supply voltage and the floating reference voltage; and
a first comparator circuit configured to monitor a voltage drop at the resistance and to set a first control signal to either a first logic level or a second logic level based on the voltage drop.

2. The half-bridge driver circuit according to claim 1, wherein the first circuit includes:
a first diode having an anode coupled to the second supply voltage and a cathode coupled to a first decoupling node, wherein a first parasitic capacitance is associated with the first diode, wherein:
the resistance has a first terminal coupled to the first decoupling node and a second terminal coupled to the floating reference voltage;
in response to determining that the monitored voltage drop is smaller than a first threshold, the first comparator is configured to set the first control signal to the first logic level, and
in response to determining that the monitored voltage drop is greater than the first threshold, the first comparator circuit is configured to set the first control signal to the second logic level.

3. The half-bridge driver circuit according to claim 2, wherein the detector circuit includes:
a combinational logic circuit configured to:
assert the signal in response to determining that the first control signal has the respective first logic level; and
de-assert the signal in response to determining that the first control signal has the respective second logic level and a second control signal has a respective second logic level.

4. The half-bridge driver circuit according to claim 2, wherein the detector circuit includes:
a second circuit including:
a current mirror including an input transistor and an output transistor;
a second diode having an anode coupled to the second supply voltage and a cathode coupled to a second decoupling node, wherein a second parasitic capacitance is associated with the second diode;
a third diode having a cathode coupled to the second decoupling node and an anode coupled via the input transistor of the current mirror to the floating reference voltage, wherein a third parasitic capacitance is associated with the third diode; and a second comparator circuit configured to:

monitor a current provided by the output transistor of the current mirror;

in response to determining that the monitored current is greater than a second threshold, set a second control signal to a respective first logic level; and in response to determining that the monitored current is smaller than the second threshold, set the second control signal to a respective second logic level.

5. The half-bridge driver circuit according to claim 4, wherein the detector circuit includes:

a combinational logic circuit configured to:

assert the signal in response to determining that the second control signal has the respective first logic level; and de-assert the signal in response to determining that a first control signal has a respective second logic level and the second control signal has the respective second logic level.

6. The half-bridge driver circuit according to claim 2, wherein the resistance is switchable between a first resistance value and a second resistance value, wherein the second resistance value is smaller than the first resistance value, and wherein the first circuit is configured to:

in response to detecting that the first control signal is set to the first logic level, activate the second resistance value of the resistance; and in response to detecting that the first control signal is set to the second logic level, activate the first resistance value of the resistance.

7. The half-bridge driver circuit according to claim 2, wherein the resistance comprises a series connection of a first resistance and a second resistance, wherein the first circuit comprises an electronic switch configured to short-circuit the second resistance in response to detecting that the first control signal is set to the first logic level.

8. The half-bridge driver circuit according to claim 2, wherein the first circuit includes a first n-channel field-effect transistor (FET), wherein a drain terminal of the first n-channel FET is coupled to the first decoupling node, a source terminal of the first n-channel FET is coupled to the first terminal of the resistance and a gate terminal of the first n-channel FET is coupled to the second node.

9. The half-bridge driver circuit according to claim 8, wherein the gate terminal of the first n-channel FET is coupled via a first current limiter resistance to the second node, and wherein the gate terminal of the first n-channel FET is coupled via a fourth diode and a second current limiter resistance to the first terminal of the resistance.

10. The half-bridge driver circuit according to claim 2, comprising at least one clamping diode selected from a list of clamping diodes including:

a first clamping diode, wherein an anode of the first clamping diode is coupled to the floating reference voltage and a cathode of the first clamping diode is coupled to the first terminal of the resistance;

a second clamping diode, wherein an anode of the second clamping diode is coupled to the floating reference voltage and a cathode of the second clamping diode is coupled to the first decoupling node; and a third clamping diode, wherein an anode of the third clamping diode is coupled to the floating reference voltage and a cathode of the third clamping diode is coupled to a second decoupling node.

11. The half-bridge driver circuit according to claim 2, wherein the first comparator circuit includes a first inverter configured to:

in response to determining that the monitored voltage drop is smaller than the first threshold, set the first control signal to high; and in response to determining that the monitored voltage drop is greater than the first threshold, set the first control signal to low.

12. The half-bridge driver circuit according to claim 4, wherein the second comparator circuit includes a second inverter configured to:

in response to determining that the monitored current is greater than the second threshold, set the second control signal to high; and in response to determining that the monitored current is smaller than the second threshold, set the second control signal to low.

13. The half-bridge driver circuit according to claim 4, wherein the second comparator circuit includes a current-to-voltage conversion circuit comprising a current-to-voltage conversion resistance coupled between the output transistor of the current mirror and the second node.

14. The half-bridge driver circuit according to claim 2, comprising:

a Zener diode, wherein an anode of the Zener diode is coupled to the floating reference voltage and a cathode of the Zener diode is coupled to the first terminal of the resistance; or a voltage-limiter FET, wherein the voltage-limiter FET is a p-channel FET having a drain terminal coupled to the floating reference voltage, a source terminal coupled to the first terminal of the resistance and a gate terminal coupled to an inverted version of a second control signal.

15. The half-bridge driver circuit according to claim 4, wherein the second circuit includes a bias circuit coupled between the anode of the third diode and a second node.

16. A half-bridge switching circuit, comprising:

a high-side electronic switch coupled to receive a first supply voltage;

a low-side electronic switch coupled to receive a reference voltage, wherein an intermediate node is coupled to the high-side electronic switch and the low-side electronic switch;

a capacitor; and a half-bridge driver circuit including:

a first node configured to be coupled to the intermediate node, a voltage at the first node representing a floating reference voltage;

a second node configured to be coupled via the capacitor to the first node;

positive and negative power supply terminals for receiving a second supply voltage;

a charge circuit configured to provide a charge current to the second node in response to a voltage at the second node being smaller than the second supply voltage, wherein the second node provides a floating supply voltage that is floating with the floating reference voltage at the first node;

a high-side driver configured to drive a control terminal of the high-side electronic switch, wherein the high-side driver is supplied by the floating supply voltage;

a low-side driver configured to drive a control terminal of the low-side electronic switch, wherein the low-side driver is supplied by the second supply voltage; and a detector circuit configured to generate a signal indicating whether the floating reference voltage at the first node is greater than the second supply voltage, wherein the detector circuit includes a first circuit, the first circuit including:

a resistance having a first terminal coupled to the first decoupling node and a second terminal coupled to the floating reference voltage; and a first comparator circuit configured to monitor a voltage drop at the resistance.

17. The half-bridge switching circuit of claim 16, wherein the first circuit includes:

a first diode having an anode coupled to the second supply voltage and a cathode coupled to a first decoupling node, wherein a first parasitic capacitance is associated with the first diode, wherein:

the resistance has a first terminal coupled to the first decoupling node and a second terminal coupled to the floating reference voltage;

in response to determining that the monitored voltage drop is smaller than a first threshold, the first comparator circuit is configured to set a first control signal to the first logic level; and in response to determining that the monitored voltage drop is greater than the first threshold, the first comparator is configured to set the first control signal to the second logic level.

18. The half-bridge switching circuit of claim 17, wherein the detector circuit includes:

a second circuit including:

a current mirror including an input transistor and an output transistor;

a second diode having an anode coupled to the second supply voltage and a cathode coupled to a second decoupling node, wherein a second parasitic capacitance is associated with the second diode;

a third diode having a cathode coupled to the second decoupling node and an anode coupled via the input transistor of the current mirror to the floating reference voltage, wherein a third parasitic capacitance is associated with the third diode; and a second comparator circuit configured to:

monitor a current provided by the output transistor of the current mirror;

in response to determining that the monitored current is greater than a second threshold, set a second control signal to a respective first logic level; and in response to determining that the monitored current is smaller than the second threshold, set the second control signal to a respective second logic level.

19. The half-bridge switching circuit of claim 18, wherein the detector circuit includes:

a combinational logic circuit configured to:

assert the signal in response to determining that the first control signal has the respective first logic level or the second control signal has the respective first logic level; and de-assert the signal in response to determining that the first control signal has the respective second logic level and the second control signal has the respective second logic level.

* * * * *